(12) United States Patent
Mishra et al.

(10) Patent No.: US 12,266,725 B2
(45) Date of Patent: *Apr. 1, 2025

(54) LATERAL III-NITRIDE DEVICES INCLUDING A VERTICAL GATE MODULE

(71) Applicant: Transphorm Technology, Inc., Goleta, CA (US)

(72) Inventors: Umesh Mishra, Montecito, CA (US); Davide Bisi, Goleta, CA (US); Geetak Gupta, Goleta, CA (US); Carl Joseph Neufeld, Goleta, CA (US); Brian L. Swenson, Santa Barbara, CA (US); Rakesh K. Lal, Isla Vista, CA (US)

(73) Assignee: Transphorm Technology, Inc., Goleta, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/923,587

(22) Filed: Jul. 8, 2020

(65) Prior Publication Data

US 2020/0343375 A1    Oct. 29, 2020

Related U.S. Application Data

(62) Division of application No. 16/598,510, filed on Oct. 10, 2019, now Pat. No. 10,756,207.

(Continued)

(51) Int. Cl.
*H01L 29/778* (2006.01)
*H01L 29/06* (2006.01)
(Continued)

(52) U.S. Cl.
CPC ...... *H01L 29/7788* (2013.01); *H01L 29/0692* (2013.01); *H01L 29/1037* (2013.01);
(Continued)

(58) Field of Classification Search
CPC ... H01L 29/122–127; H01L 29/15–158; H01L 29/1041; H01L 29/2003;
(Continued)

(56) References Cited

U.S. PATENT DOCUMENTS 7,244,968 B2 *   7/2007   Yoo .................. H01L 33/06
                                                          257/101
7,795,642 B2     9/2010   Suh et al.
(Continued)

FOREIGN PATENT DOCUMENTS

CN    101897029    11/2010
CN    102969354     3/2013
(Continued)

OTHER PUBLICATIONS

Ando et al., Semiconductor device, Feb. 11, 2010, machine translation of WO 2010016564 A1, pp. 1-11. (Year: 2010).*

(Continued)

*Primary Examiner* — Natalia A Gondarenko
(74) *Attorney, Agent, or Firm* — Fish & Richardson P.C.

(57) ABSTRACT

A lateral III-N device has a vertical gate module with III-N material orientated in an N-polar or a group-III polar orientation. A III-N material structure has a III-N buffer layer, a III-N barrier layer, and a III-N channel layer. A compositional difference between the III-N barrier layer and the III-N channel layer causes a 2DEG channel to be induced in the III-N channel layer. A p-type III-N body layer is disposed over the III-N channel layer in a source side access region but not over a drain side access region. A n-type III-N capping layer over the p-type III-N body layer. A source electrode that contacts the n-type III-N capping layer is electrically connected to the p-type III-N body layer and is electrically isolated from the 2DEG channel when the gate (Continued)

electrode is biased relative to the source electrode at a voltage that is below a threshold voltage.

9 Claims, 26 Drawing Sheets

Related U.S. Application Data

(60) Provisional application No. 62/745,213, filed on Oct. 12, 2018.

(51) Int. Cl.
  *H01L 29/10* (2006.01)
  *H01L 29/20* (2006.01)
  *H01L 29/205* (2006.01)
  *H01L 29/66* (2006.01)

(52) U.S. Cl.
  CPC ...... *H01L 29/205* (2013.01); *H01L 29/66462* (2013.01); *H01L 29/7783* (2013.01); *H01L 29/2003* (2013.01)

(58) Field of Classification Search
  CPC ......... H01L 29/66462; H01L 29/66431; H01L 29/1066; H01L 29/4236; H01L 29/778–7789; H01L 27/04; H01L 27/0605; H01L 27/085; H01L 27/0922; H01L 27/095; H01L 27/10; H01L 2924/13064; H01L 29/0692; H01L 29/1037; H01L 29/205; H01L 29/045; H01L 29/0619; H01L 29/0895; H01L 29/402; H01L 29/41758; H01L 29/41766; H01L 29/4238; H01L 29/0657; H01L 29/42356
  USPC .............................. 257/76, 77, 194, 29.104
  See application file for complete search history.

(56) References Cited

U.S. PATENT DOCUMENTS

| | | | |
|---|---|---|---|
| 7,812,371 | B2 * | 10/2010 | Kaya ............... H01L 29/7787 257/190 |
| 7,851,825 | B2 | 12/2010 | Suh et al. |
| 7,875,907 | B2 | 1/2011 | Honea et al. |
| 7,884,394 | B2 | 2/2011 | Wu et al. |
| 7,898,004 | B2 | 3/2011 | Wu et al. |
| 7,915,643 | B2 | 3/2011 | Suh et al. |
| 7,939,391 | B2 | 5/2011 | Suh et al. |
| 7,965,126 | B2 | 6/2011 | Honea et al. |
| 8,138,529 | B2 | 3/2012 | Wu |
| 8,193,562 | B2 | 6/2012 | Suh et al. |
| 8,237,198 | B2 | 8/2012 | Wu et al. |
| 8,289,065 | B2 | 10/2012 | Honea et al. |
| 8,344,424 | B2 | 1/2013 | Suh et al. |
| 8,389,977 | B2 | 3/2013 | Chu et al. |
| 8,390,000 | B2 | 3/2013 | Chu et al. |
| 8,431,965 | B2 | 4/2013 | Takemae |
| 8,455,931 | B2 | 6/2013 | Wu |
| 8,493,129 | B2 | 7/2013 | Honea et al. |
| 8,508,281 | B2 | 8/2013 | Honea et al. |
| 8,519,438 | B2 | 8/2013 | Mishra et al. |
| 8,530,996 | B2 | 9/2013 | Shono |
| 8,531,232 | B2 | 9/2013 | Honea et al. |
| 8,536,622 | B2 | 9/2013 | Takemae et al. |
| 8,541,815 | B2 | 9/2013 | Takemae et al. |
| 8,541,818 | B2 | 9/2013 | Wu et al. |
| 8,569,124 | B2 | 10/2013 | Akiyama et al. |
| 8,581,300 | B2 | 11/2013 | Yamada |
| 8,592,974 | B2 | 11/2013 | Wu |
| 8,598,937 | B2 | 12/2013 | Lal et al. |
| 8,603,880 | B2 | 12/2013 | Yamada |
| 8,624,662 | B2 | 1/2014 | Parikh et al. |
| 8,633,517 | B2 | 1/2014 | Kamada |
| 8,633,518 | B2 | 1/2014 | Suh et al. |
| 8,643,062 | B2 | 2/2014 | Parikh et al. |
| 8,648,643 | B2 | 2/2014 | Wu |
| 8,664,927 | B2 | 3/2014 | Shono |
| 8,675,326 | B2 | 3/2014 | Shono |
| 8,692,294 | B2 | 4/2014 | Chu et al. |
| 8,716,141 | B2 | 5/2014 | Dora et al. |
| 8,742,459 | B2 | 6/2014 | Mishra et al. |
| 8,742,460 | B2 | 6/2014 | Mishra et al. |
| 8,766,711 | B2 | 7/2014 | Takemae |
| 8,772,842 | B2 | 7/2014 | Dora |
| 8,773,176 | B2 | 7/2014 | Miyazaki et al. |
| 8,786,327 | B2 | 7/2014 | Honea et al. |
| 8,803,246 | B2 | 8/2014 | Wu et al. |
| 8,816,497 | B2 | 8/2014 | Wu |
| 8,816,751 | B2 | 8/2014 | Honea et al. |
| 8,836,301 | B2 | 9/2014 | Shono |
| 8,836,308 | B2 | 9/2014 | Shono |
| 8,836,380 | B2 | 9/2014 | Takemae |
| 8,841,702 | B2 | 9/2014 | Mishra et al. |
| 8,847,283 | B2 | 9/2014 | Kamada et al. |
| 8,860,495 | B2 | 10/2014 | Lal et al. |
| 8,878,248 | B2 | 11/2014 | Ishiguro et al. |
| 8,878,571 | B2 | 11/2014 | Takemae |
| 8,883,581 | B2 | 11/2014 | Ohki |
| 8,890,206 | B2 | 11/2014 | Yamada |
| 8,890,314 | B2 | 11/2014 | Wu |
| 8,895,421 | B2 | 11/2014 | Parikh et al. |
| 8,895,423 | B2 | 11/2014 | Dora |
| 8,901,604 | B2 | 12/2014 | Mishra et al. |
| 8,912,839 | B2 | 12/2014 | Honea et al. |
| 8,933,489 | B2 | 1/2015 | Kikkawa |
| 8,952,750 | B2 | 2/2015 | Wu |
| 8,957,453 | B2 | 2/2015 | Yamada et al. |
| 8,962,409 | B2 | 2/2015 | Tomabechi |
| 9,006,787 | B2 | 4/2015 | Yamada |
| 9,035,356 | B2 | 5/2015 | Yamada |
| 9,041,435 | B2 | 5/2015 | Honea et al. |
| 9,041,465 | B2 | 5/2015 | Bouisse |
| 9,059,076 | B2 | 6/2015 | Wu et al. |
| 9,059,136 | B2 | 6/2015 | Kamada et al. |
| 9,087,718 | B2 | 7/2015 | Lal |
| 9,093,366 | B2 | 7/2015 | Mishra et al. |
| 9,099,351 | B2 | 8/2015 | Nishimori et al. |
| 9,099,545 | B2 | 8/2015 | Akiyama et al. |
| 9,111,961 | B2 | 8/2015 | Chu et al. |
| 9,136,107 | B2 | 9/2015 | Katani et al. |
| 9,142,638 | B2 | 9/2015 | Yamada |
| 9,142,658 | B2 | 9/2015 | Kikkawa et al. |
| 9,147,760 | B2 | 9/2015 | Mishra et al. |
| 9,165,766 | B2 | 10/2015 | Keller et al. |
| 9,171,730 | B2 | 10/2015 | Chowdhury et al. |
| 9,171,836 | B2 | 10/2015 | Lal et al. |
| 9,171,910 | B2 | 10/2015 | Wu et al. |
| 9,184,275 | B2 | 11/2015 | Mishra et al. |
| 9,190,295 | B2 | 11/2015 | Wu |
| 9,196,716 | B2 | 11/2015 | Mishra et al. |
| 9,209,176 | B2 | 12/2015 | Wu et al. |
| 9,224,671 | B2 | 12/2015 | Parikh et al. |
| 9,224,721 | B2 | 12/2015 | Wu |
| 9,224,805 | B2 | 12/2015 | Mishra et al. |
| 9,231,075 | B2 | 1/2016 | Yamada |
| 9,244,848 | B2 | 1/2016 | Boyd et al. |
| 9,245,992 | B2 | 1/2016 | Keller et al. |
| 9,245,993 | B2 | 1/2016 | Keller et al. |
| 9,257,547 | B2 | 2/2016 | Fichtenbaum et al. |
| 9,293,458 | B2 | 3/2016 | Parikh et al. |
| 9,293,561 | B2 | 3/2016 | Mishra et al. |
| 9,299,822 | B2 | 3/2016 | Kikkawa |
| 9,318,593 | B2 | 4/2016 | Wu et al. |
| 9,343,560 | B2 | 5/2016 | Suh et al. |
| 9,349,805 | B2 | 5/2016 | Ito et al. |
| 9,362,903 | B2 | 6/2016 | Wu et al. |
| 9,373,699 | B2 | 6/2016 | Chu et al. |
| 9,401,341 | B2 | 7/2016 | Wu |
| 9,425,268 | B2 | 8/2016 | Minoura et al. |
| 9,437,707 | B2 | 9/2016 | Mishra et al. |
| 9,437,708 | B2 | 9/2016 | Mishra et al. |

(56) References Cited

U.S. PATENT DOCUMENTS

| | | |
|---|---|---|
| 9,443,849 B2 | 9/2016 | Wu et al. |
| 9,443,938 B2 | 9/2016 | Mishra et al. |
| 9,490,324 B2 | 11/2016 | Mishra et al. |
| 9,496,137 B2 | 11/2016 | Chu et al. |
| 9,520,491 B2 | 12/2016 | Chowdhury et al. |
| 9,536,966 B2 | 1/2017 | Ogino |
| 9,536,967 B2 | 1/2017 | Kikkawa et al. |
| 9,537,425 B2 | 1/2017 | Honea |
| 9,543,940 B2 | 1/2017 | Wang et al. |
| 9,590,060 B2 | 3/2017 | Lal |
| 9,590,494 B1 | 3/2017 | Zhou et al. |
| 9,620,616 B2 | 4/2017 | Yamada et al. |
| 9,634,100 B2 | 4/2017 | Mishra et al. |
| 9,640,648 B2 | 5/2017 | Kikkawa |
| 9,660,640 B2 | 5/2017 | Wang et al. |
| 9,666,708 B2 | 5/2017 | Then et al. |
| 9,685,323 B2 | 6/2017 | Keller et al. |
| 9,685,338 B2 | 6/2017 | Minoura et al. |
| 9,690,314 B2 | 6/2017 | Honea et al. |
| 9,741,702 B2 | 8/2017 | Wu |
| 9,818,686 B2 | 11/2017 | Wu et al. |
| 9,818,840 B2 | 11/2017 | Kikkawa |
| 9,831,315 B2 | 11/2017 | Chu et al. |
| 9,842,922 B2 | 12/2017 | Mishra et al. |
| 9,865,719 B2 | 1/2018 | Keller et al. |
| 9,899,998 B2 | 2/2018 | Honea et al. |
| 9,935,190 B2 | 4/2018 | Wu et al. |
| 9,941,399 B2 | 4/2018 | Mishra et al. |
| 9,991,884 B2 | 6/2018 | Wang et al. |
| 10,043,896 B2 | 8/2018 | Mishra et al. |
| 10,043,898 B2 | 8/2018 | Lal |
| 10,063,138 B1 | 8/2018 | Zhou et al. |
| 10,388,753 B1 | 8/2019 | Armstrong et al. |
| 10,756,207 B2 * | 8/2020 | Mishra ............... H01L 29/7789 |
| 2006/0065912 A1 | 3/2006 | Beach |
| 2009/0278172 A1 | 11/2009 | Kaya et al. |
| 2009/0278197 A1 | 11/2009 | Ohta et al. |
| 2010/0047976 A1* | 2/2010 | Otake ............... H01L 29/66462 |
| | | 257/E21.409 |
| 2010/0258841 A1* | 10/2010 | Lidow ............... H01L 29/1066 |
| | | 257/192 |
| 2012/0187452 A1* | 7/2012 | Saito ............... H01L 29/66462 |
| | | 257/E29.091 |
| 2013/0056746 A1 | 3/2013 | Joshin |
| 2013/0234156 A1 | 9/2013 | Okada et al. |
| 2013/0264578 A1* | 10/2013 | Mishra ............... H01L 29/205 |
| | | 257/192 |
| 2014/0159048 A1* | 6/2014 | Huang ............... H01L 29/7789 |
| | | 438/172 |
| 2014/0175453 A1 | 6/2014 | Yamada |
| 2014/0203329 A1 | 7/2014 | Saitoh et al. |
| 2014/0264369 A1 | 9/2014 | Padmanabhan et al. |
| 2014/0264379 A1* | 9/2014 | Kub ............... H01L 29/365 |
| | | 257/77 |
| 2015/0162424 A1 | 6/2015 | Briere |
| 2015/0179823 A1 | 6/2015 | Kurita |
| 2015/0221757 A1 | 8/2015 | Nakayama et al. |
| 2016/0071967 A1 | 3/2016 | Prechtl et al. |
| 2016/0087089 A1* | 3/2016 | Prechtl ............... H01L 29/7786 |
| | | 257/76 |
| 2017/0018640 A1 | 1/2017 | Then et al. |
| 2017/0125562 A1 | 5/2017 | Prechtl et al. |
| 2018/0102425 A1 | 4/2018 | Mishra et al. |
| 2018/0158909 A1 | 6/2018 | Mishra et al. |
| 2019/0334023 A1* | 10/2019 | Nakata ............... H01L 29/205 |
| 2020/0119179 A1 | 4/2020 | Mishra et al. |

FOREIGN PATENT DOCUMENTS

| | | | |
|---|---|---|---|
| CN | 103210496 | 7/2013 | |
| CN | 103582938 | 2/2014 | |
| CN | 103887309 | 6/2014 | |
| JP | 2005-019509 | 1/2005 | |
| JP | 2009-509343 | 3/2009 | |
| JP | 2011-077400 | 4/2011 | |
| TW | 201010076 | 3/2010 | |
| TW | 201423987 | 6/2014 | |
| WO | WO-2010016564 A1 * | 2/2010 | ......... H01L 21/3085 |
| WO | WO 2015/004853 | 1/2015 | |

OTHER PUBLICATIONS

Ando et al., Semiconductor Device, 2010, machine translation of WO 2010/016564, pp. 1-12. (Year: 2010).*

Authorized officer Blaine R. Copenheaver, Invitation to Pay Additional Fees and, Where Applicable, Protest Fee in Application No. PCT/US2019/055905, mailed on Dec. 5, 2019, 2 pages.

Authorized officer Blaine R. Copenheaver, International Search Report and Written Opinion in PCT/US2019/055905, mailed Feb. 5, 2020, 10 pages.

Barr et al., "High Voltage GaN Switch Reliability," WIPDA Conference, Atlanta, GA, Nov. 2018, 7 pages.

Coffie, "Characterizing and Suppressing DC-to-RF Dispersion in AlGaN/GaN High Electron Mobility Transistors," 2003, PhD Thesis, University of California, Santa Barbara, 169 pages.

Coffie et al., "Unpassivated p-GaN/AlGaN/GaN HEMTs with 7.1 W/mm at 10 GhZ," Electronic Letters, 2003, 39(19):1419-1420.

Chu et al., "1200-V Normally Off GaN-on-Si Field-effect Transistors with Low Dynamic On-Resistance," IEEE Electron Device Letters, 2011, 32(5):632-634.

Dora et al., "High Breakdown Voltage Achieved on AlGaN/GaN HEMTs with Integrated Slant Field Plates," IEEE Electron Device Letters, 2006, 27(9):713-715.

Dora et al., "$ZrO_2$ Gate Dielectrics Produced by Ultraviolet Ozone Oxidation for GaN and AlGaN/GaN Transistors," J. Vac. Sci. Technol. B, 2006, 24(2)575-581.

Dora, "Understanding Material and Process Limits for High Breakdown Voltage AlGaN/GaN HEMTs," PhD Thesis, University of California, Santa Barbara, Mar. 2006, 157 pages.

Huang and Cuadra, "Preventing GaN Device VHF Oscillation," APEC 2017 Industry Session, Mar. 2017, 25 pages.

Keller et al., "GaN—GaN Junctions with Ultrathin AlN Interlayers: Expanding Heterojunction Design," Applied Physics Letters, 2002, 80(23):4387-4389.

Mishra et al., "AlGaN/GaN HEMTs—An Overview of Device Operation and Applications," Proceedings of the IEEE, 2002, 90(6):1022-1031.

Parikh et al., "Commercialization of High 600V GaN-on-Silicon Power HEMTs and Diodes," 2013 IEEE, 5 pages.

Parikh, "Driving the Adoption of High-voltage Gallium Nitride Filed-effect Transistors," IEEE Power Electronics Magazine, Sep. 2017, 3 pages.

Parikh et al., "650 Volt GaN Commercialization Reaches Automotive Standards," ECS Transactions, 2017, 80(7):17-28.

Shen, "Advanced Polarization-based Design of AlGaN/GaN HEMTs," Jun. 2004, PhD Thesis, University of California, Santa Barbara, 192 pages.

Smith and Barr, "Reliability Lifecycle of GaN Power Devices," Transphorm Inc., Mar. 2017, 8 pages.

Suh et al. "High-Breakdown Enhancement-mode AlGaN/GaN HEMTs with Integrated Slant Field-Plate," Electron Devices Meeting, 2006, IEDM '06 International, 3 pages.

Wang et al., "Investigation of Driver Circuits for GaN HEMTs in Leaded Packages," Workshop on Wide Bandgap Power Devices and Applications (WiPDA), 2014 IEEE, pp. 81-87.

Wang, et al., "Design and Implementation of a High-efficiency Three-level Inverter Using GaN HEMTs," PCIM Europe 2015, May 19-21, 2015, Nuremberg, Germany, 7 pages.

Wang et al., "Paralleling GaN HEMTs for Diode-free Bridge Power Converters," 2015 IEEE Applied Power Electronics Conference and Exposition (APEC), Charlotte, NC, 2015, pp. 752-758.

Wu, "AlGaN/GaN Microwave Power High-Mobility Transistors," PhD Thesis, University of California, Santa Barbara, Jul. 1997, 134 pages.

(56) References Cited

OTHER PUBLICATIONS

Wu, "Paralleling High-speed GaN Power HEMTs for Quadrupled Power Output," Applied Power Electronics Conference and Exposition (APEC), 2013, pp. 211-214.

Wu et al., "A 97.8% Efficient GaN HEMT Boost Converter with 300-W Output Power at 1 MHz," Electronic Device Letters, 2008, IEEE, 29(8):824-826.

Wu et al., "High-frequency, GaN Diode-free Motor Drive Inverter with Pure Sine Wave Output," PCIM Europe 2012, Conference Digest, pp. 40-43.

Wu et al., "Total GaN Solution to Electrical Power Conversion," the 69th IEEE Device Research Conference, Conference Digest, Jun. 20-22, 2011, pp. 217-218.

Wu et al., "Advances in Reliability and Operation Space of High-voltage GaN Power Devices on Si Substrates," (2014) IEEE, 3 pages.

Wu et al., "kV-Class GaN-on-Si HEMTs Enabling 99% Efficiency Converter at 800 V and 100 kHz," IEEE Transactions on Power Electronics. 2014 29(6):2634-2637.

Xu et al., "Investigation of 600 V GaN HEMTs for High Efficiency and High Temperature Applications," Applied Power Electronics Conference and Exposition (APEC), Apr. 2014, pp. 131-136.

Zhang et al., "Common-mode Circulating Current Control of Paralleled Interleaved Three-phase Two-level Voltage-source Converters with Discontinuous Space-vector Modulation," IEEE Transactions on Power Electronics, Dec. 2011, 26(12):3925-3935.

Zhang et al., "Evaluation of 600 V Cascode GaN HEMT in Device Characterization and All-GaN-based LLC Resonant Converter," In Proc. Energy Conversion Congress and Exposition (ECCE), Sep. 2013 IEEE, pp. 3571-3578.

Zhang, "High Voltage GaN HEMTs with Low On-resistance for Switching Applications," PhD Thesis, University of California, Santa Barbara, Sep. 2002, 166 pages.

Zhang et al., "Gate Drive Design Considerations for High Voltage Cascode GaN HEMT," Applied Power Electronics Conference and Exposition (APEC), Mar. 2014, pp. 1484-1489.

Zhang et al., "Impact of Interleaving on AC Passive Components of Paralleled Three-phase Voltage-source Converters," IEEE Transactions on Industry Applications, May/Jun. 2010, 46(3):1042-1054.

Zhou et al., "High-efficiency True Bridgeless Totem Pole PFC Based on GaN HEMTs: Design Challenges and Cost-effective Solution," PCIM Europe 2015, pp. 1482-1489.

Zhou and Wu, "99% Efficiency True-bridgeless Totem-pole PFC Based on GaN HEMTs," PCIM Europe May 14-16, 2013, pp. 1017-1022.

Zuk and Campeau, "How to Design with GaN in 1 Hour!," APEC 2017 Exhibitor Session, Mar. 2017, 24 pages.

Extended Search Report and Written Opinion in European Application No. 19872092.2, dated Jun. 29, 2022, 7 pages.

Office Action in Chinese Appln. No. 201980066795.7, dated Jul. 28, 2023, 20 pages (with English translation).

Office Action in Taiwanese Appln. No. 108136889, dated Jul. 7, 2023, 6 pages (with English Search Report).

Office Action in Japanese Appln. No. 2021-519652, mailed on Oct. 10, 2023, 6 pages (with English translation).

Office Action in Korean Appln. No. 10-2021-7012473, dated Jun. 26, 2024, 10 pages (with English translation).

\* cited by examiner

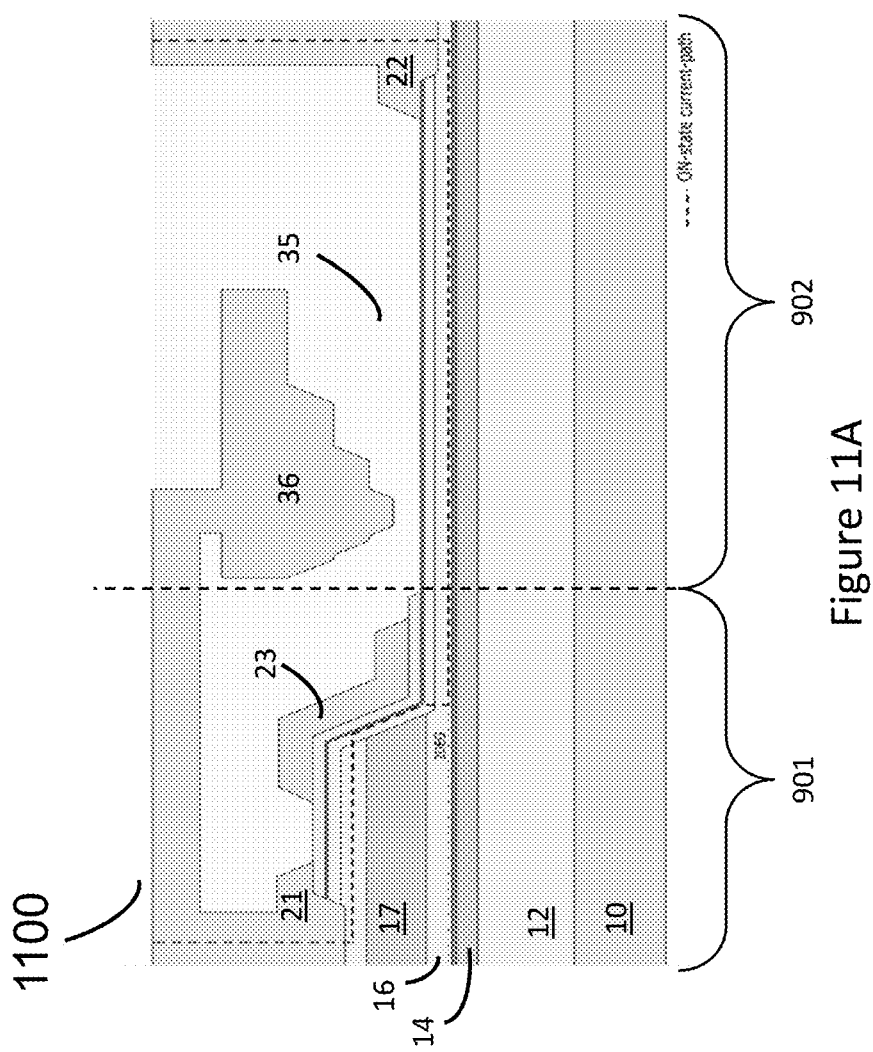

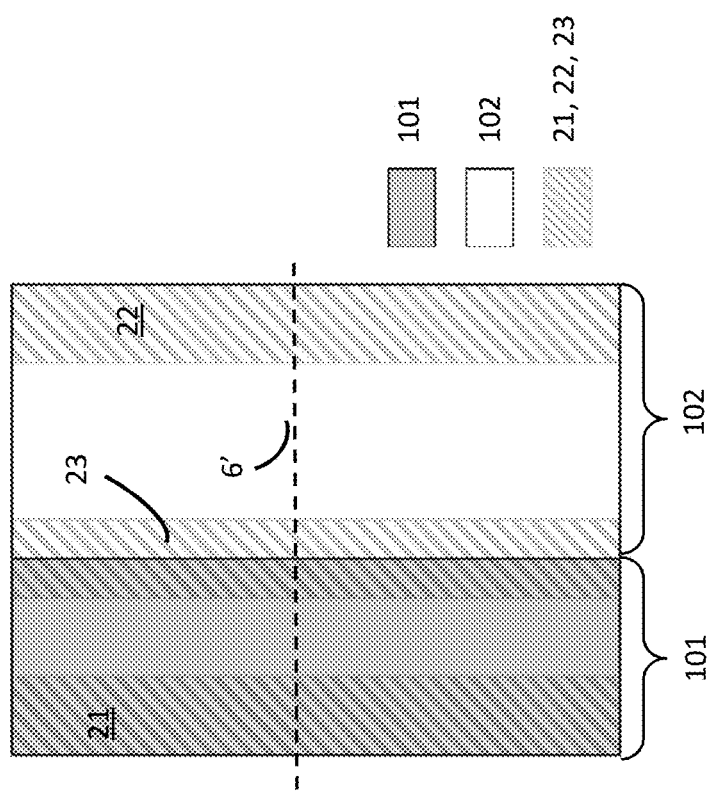

101
102
21, 22, 23

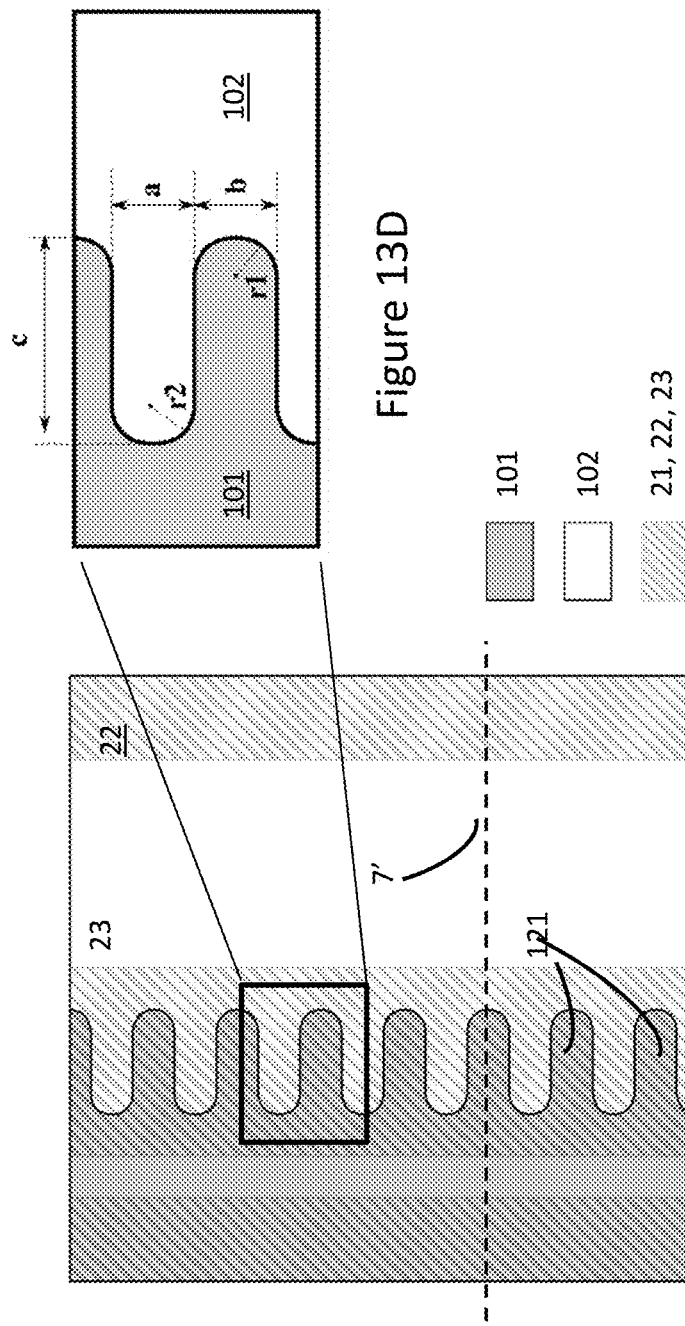

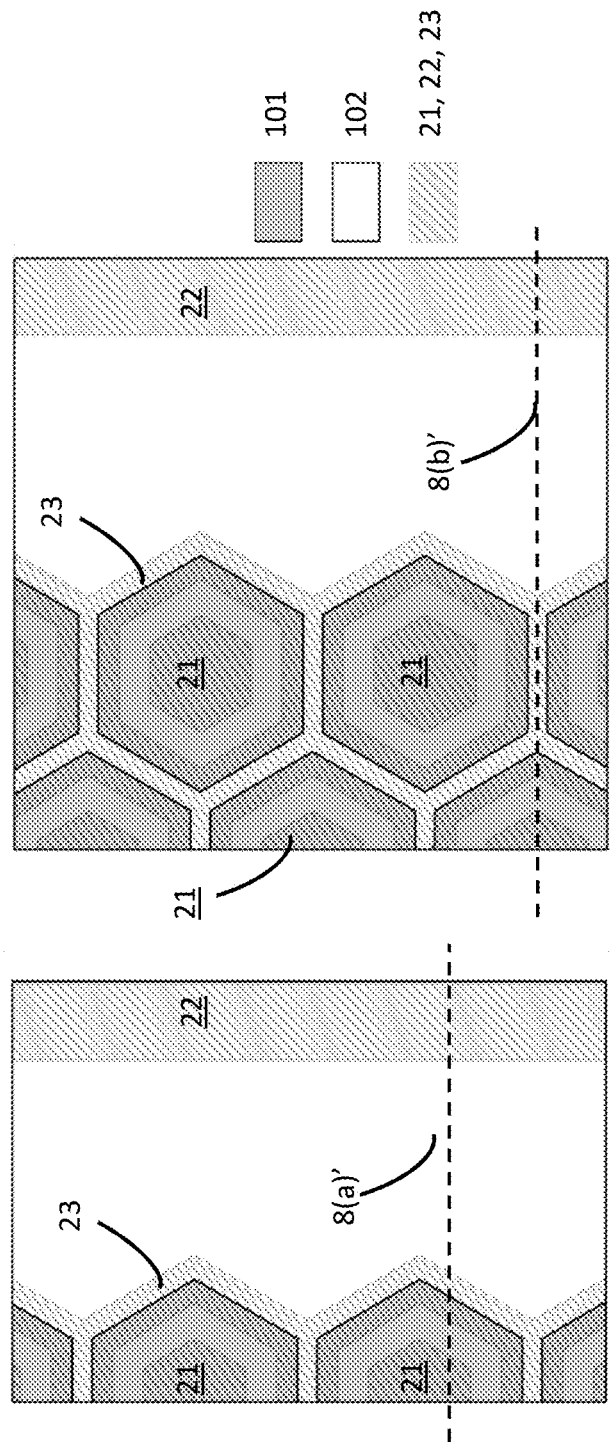

LATERAL III-NITRIDE DEVICES INCLUDING A VERTICAL GATE MODULE

CROSS-REFERENCE TO RELATED APPLICATIONS

This is a divisional of U.S. application Ser. No. 16/598,510, filed on Oct. 10, 2019, which claims priority to U.S. Application No. 62/745,213, filed on Oct. 12, 2018. The disclosures of the prior applications are considered part of and are incorporated by reference in the disclosure of this application.

TECHNICAL FIELD

The disclosed technologies relate to semiconductor devices, in particular III-Nitride transistors and switches.

BACKGROUND

Currently, typical power semiconductor devices, including devices such as transistors, diodes, power MOSFETs and insulated gate bipolar transistors (IGBTs), are fabricated with silicon (Si) semiconductor material. More recently, wide-bandgap materials (SiC, III-N, III-O, diamond) have been considered for power devices due to their superior properties. III-Nitride or III-N semiconductor devices, such as gallium nitride (GaN) devices, are now emerging as attractive candidates to carry large currents, support high voltages and provide very low on-resistance and fast switching times. Although high voltage III-N diodes, transistors and switches are beginning to be commercialized, further improvements are needed in order to improve the performance, efficiency, reliability and cost of these devices. The term device will be used in general for any transistor or switch or diode when there is no need to distinguish between them.

Cross-sectional views of a group-III polar lateral III-N device 100A and an N-Polar lateral III-N device 100B are illustrated in FIGS. 1A and 1B, respectively. Devices 100A and 100B each include a source contact 21, a drain contact 22, a gate contact 23, and access regions 82 and 83. As used herein, the "access regions" of a device refer to the two regions between the source and gate contacts, and between the gate and drain contacts of the device, i.e., regions 82 and 83, respectively, in FIGS. 1A and 1B. Region 82, the access region on the source side of the gate, is typically referred to as the source side access region, and region 83, the access region on the drain side of the gate, is typically referred to as the drain side access region. As used herein, the "gate region" 81 of a device refers to the portion of the transistor between the two access regions 82 and 83 in FIGS. 1A and 1B. The gate module of the device refers to the portion of the layers and materials of the device that are in or adjacent to the gate region of the device, and within which the electric field is modulated through application of gate voltages in order to modulate the channel conductivity in the gate region of the device. The device channel refers to the conductive region that serves as the current path of the device between the source contact and drain contact when the device is biased in the ON state. The source contact 21 and the drain contact 22 are electrically connected to a lateral two-dimensional electron gas (2DEG) channel 19 (indicated by the dashed line in FIG. 1A) which is induced in a III-N channel layer 16 adjacent the interface between a III-N barrier layer 14 and the III-N channel layer 16 and serves as the device channel. The device channel in the gate region 81 of the devices of FIGS. 1A and 1B is formed in a lateral direction from the portion of the 2DEG channel below the gate contact 23.

Typical III-N high electron mobility transistors (HEMTs) and related devices are formed on III-Nitride materials grown in a group-III polar (e.g., Ga-polar) orientation, such as the [0 0 0 1] (C-plane) orientation, as shown in FIG. 1A. That is, the source, gate, and drain contacts of the HEMT are formed over the group-III face (e.g., [0 0 0 1] face) of the III-N material layers, which is typically on an opposite side of the III-N material layers from the substrate on which the III-N layers are formed. Alternatively, III-N HEMTs can be formed on III-Nitride materials grown in an N-Polar (i.e., N-face) orientation, such as the [0 0 0 -1] orientation, as shown in FIG. 1B. In this case, the source, gate, and drain contacts of the HEMT are formed over the N-face (e.g., [0 0 0 -1] face) of the III-N material layers. N-polar III-N materials have polarization fields with opposite direction than group-III polar III-N materials, thus can enable the implementation of III-N devices which cannot be fabricated using group-III polar structures. N-polar III-N devices can in some cases exhibit superior characteristics when compared to group-III polar devices, including lower static and dynamic on-resistance, with higher current density, higher power density, and higher reliability.

Furthermore, III-N HEMTs are typically depletion-mode (D-mode) devices, which means they are normally-on, i.e., they conduct current when zero voltage is applied to the gate relative to the source and a positive voltage is applied to the drain relative to the source. However, in power electronics, it is more desirable to have normally-off devices, called enhancement mode (E-mode) devices, which do not conduct substantial current at zero gate voltage and require a sufficiently positive voltage applied to the gate relative to the source in order to be turned on. In power electronics, the use of E-mode devices can help to increase safety and to reduce the potential for damage to the device, to other circuit components, or to the entire power system by preventing accidental turn on of the device in case of circuit failure. However, improvements in the electrical performance of E-mode devices are still needed to further increase market adaptation.

SUMMARY

Described herein are lateral III-N (e.g., GaN) devices having a vertical gate module, for which the III-N material is orientated in an N-polar or a group-III polar orientation. The device structures can be configured to have stable threshold-voltage, low leakage current, and high breakdown voltages while maintaining a small separation between the gate and the drain ensuring low on-resistance. The details of one or more embodiments of the subject matter described in this specification are set forth in the accompanying drawings and the description below. Other features, aspects, and advantages of the subject matter will become apparent from the description, the drawings, and the claims.

In a first aspect, a III-N device is described. The III-N device comprises a III-N material structure over a substrate. The III-N material structure comprises a III-N buffer layer, a III-N barrier layer, and a III-N channel layer, where a compositional difference between the III-N barrier layer and the III-N channel layer causes a 2DEG channel to be induced in the III-N channel layer. The III-N device further comprises a p-type III-N body layer over the III-N channel layer in a source side access region of the device but not over the III-N channel layer in a drain side access region of the device, and n-type III-N capping layer over the p-type III-N body layer. The III-N device further comprising a source electrode, a gate electrode, and a drain electrode. The source electrode contacts the n-type III-N capping layer and is electrically connected to the p-type III-N body layer, and the drain electrode contacts the III-N channel layer, where the source electrode is electrically isolated from the 2DEG channel when the gate electrode is biased relative to the source electrode at a voltage that is below a threshold voltage of the device.

In a second aspect, a III-N transistor is described. The transistor comprises a III-N material structure, and a drain electrode connected to a lateral 2DEG channel in the III-N material structure. The III-N transistor further comprises a source electrode separated from the lateral 2DEG channel by a current blocking layer. The III-N transistor further comprising a gate electrode configured to modulate current flowing in a slanted or vertical channel between the source electrode and the lateral 2DEG channel, where a threshold voltage of the transistor is greater than 0V.

In a third aspect, an electronic device is described. The electronic device comprises an N-polar III-N material structure. The III-N material structure comprises a III-N channel layer, a p-type GaN body layer, and an n-type GaN capping layer. The device further comprises a gate contact between a source contact and a drain contact, where the p-type GaN body layer is between the source contact and the III-N channel layer and the drain contact directly contacts the III-N channel layer. The device further comprising a III-N layer structure between the gate contact and a sidewall of the p-type GaN body layer, where the III-N layer structure contacts the n-type GaN capping layer in a first region between the source contact and the gate contact and contacts the III-N channel layer in a second region between the gate contact and the drain contact.

In a fourth aspect, an electronic device is described. The device comprises an N-polar III-N material structure comprising a first n-type GaN layer with a first doping density over a first p-type GaN layer with a second doping density. The device further comprises an electrode at least partially over the n-type GaN layer, where the electrode is electrically connected to the p-type layer through a tunnel junction. The tunnel junction comprises an $Al_yGa_{1-y}N$ layer with $0<y\leq1$ in an interface between the p-type GaN layer and the n-type GaN layer.

In a fifth aspect, a method of operating a III-N device is described. The method comprises biasing a gate contact relative to a source contact at a voltage greater than a threshold voltage, where an inversion channel forms at a vertical interface between a gate insulator layer and a p-type III-N layer, thereby electrically connecting the source contact to a lateral 2DEG channel. The method further comprising biasing a drain contact at a positive voltage relative to the source contact, where electrons flow from the source contact through the inversion channel to the lateral 2DEG channel, and a continuous device channel is formed between the source contact and the drain contact.

In a sixth aspect, an electronic device is described. The device comprises a substrate and a III-N material structure over the substrate. The device further comprises a gate electrode and a gate insulating layer, where the gate insulating layer is between the III-N material structure and the gate electrode. The device further comprising a source electrode and a drain electrode, the source electrode comprises a portion contacting the III-N material structure. The source electrode and the drain electrode being on a side of the III-N material structure opposite the substrate, where the portion of the source electrode in contact with the III-N material structure is formed between the gate electrode and the drain electrode.

In a seventh aspect, an electronic device is described. The device comprises a III-N material structure over a substrate. The III-N material structure comprises a III-N channel layer over a III-N buffer layer. The III-N material structure further comprises a III-N barrier layer over the III-N channel layer, where a compositional difference between the III-N barrier layer and the III-N channel layer causes a lateral 2DEG channel to be induced in the III-N channel layer. The device further comprises a source contact, a gate contact, and a drain contact over the III-N material structure on a side opposite the substrate. The device further comprises a p-type III-N body layer over the III-N barrier layer in a source side access region but not over the III-N channel layer in a drain side access region, and a n-type III-N capping layer over the p-type III-N body layer. The source contact is contacting the n-type capping layer and electrically connected to the p-type III-N body layer, where the drain is electrically connected to the 2DEG channel and the source is electrically isolated from the 2DEG channel when the device is biased below a threshold voltage.

In an eighth aspect, an electronic device is described. The electronic device comprises a III-N material structure over a substrate. The III-N material structure comprises a III-N buffer layer and a p-type layer over the III-N buffer layer in a source side access region but not over the buffer layer in a drain side access region. The device further comprising a source contact, a gate contact, and a drain contact over the III-N buffer layer on a side opposite the substrate. The device further comprising a III-N channel layer and a III-N barrier layer formed over the III-N material structure extending between the source contact and the drain contact, where a compositional difference between the III-N barrier layer and the III-N channel layer causes a 2DEG channel to be induced in the III-N channel layer, the source contact is connected to the p-type layer and a sidewall angle of the p-type layer forms a semi-polar crystal orientation of the III-N channel layer in a region below the gate contact.

In a ninth aspect, an N-polar III-N device is described. The III-N device comprises a III-N material structure over a substrate. The III-N material structure comprises a III-N barrier layer over a III-N buffer layer, and a III-N channel layer over the III-N barrier layer, where a compositional difference between the III-N barrier layer and the III-N channel layer causes a lateral 2DEG channel to be induced in the III-N channel layer. The device further comprises a p-type III-N body layer over the III-N channel layer in a source side access region, the p-type III-N body layer having a sidewall at a non-zero angle relative to a top surface of the III-N channel layer. The device further comprising a n-type III-N capping layer over the p-type III-N body layer. A source contact contacting the n-type III-N capping layer. A drain contact contacting the III-N channel layer. A gate insulator layer contacting a gate contact, and the gate insulator layer contact in the sidewall of the p-type III-N body layer at the non-zero angle.

Each of the electronic devices, and transistors described herein can include one or more of the following features. The device can be N-polar device, where the III-N barrier layer is between the III-N channel layer and the III-N buffer layer. The device can comprise a gate insulator layer, where the gate insulator is formed over a vertical or slanted sidewall of the p-type layer. The device can be configured such that an inversion channel is formed in the p-type III-N body layer or the III-N layer structure adjacent to the gate insulator layer when the gate electrode is biased relative to the source electrode at a voltage greater than a threshold voltage of the device. The device can comprise a III-N layer structure between the gate insulator layer and the III-N body layer, where the III-N layer structure contacts the III-N capping layer in the source side access region and contacts the III-N channel layer in the drain side access region. The angle between the vertical or slanted sidewall of the III-N body layer and the III-N material structure is between 20°-80°. The device can comprise a tunnel junction between the source electrode and the p-type III-N body layer, where the tunnel junction further comprises a second n-type GaN layer between a first n-type GaN layer and an $Al_yGa_{1-y}N$ layer, and a second p-type GaN layer between a first p-type GaN layer and an $Al_yGa_{1-y}N$ layer, where the second n-type GaN layer and the second p-type GaN layer have a doping density greater than a first and second doping densities.

As used herein, the terms III-Nitride or III-N materials, layers, devices, etc., refer to a material or device comprised of a compound semiconductor material according to the stoichiometric formula $B_wAl_xIn_yGa_zN$, where w+x+y+z is about 1 with $0 \leq w \leq 1$, $0 \leq x \leq 1$, $0 \leq y \leq 1$, and $0 \leq z \leq 1$. III-N materials, layers, or devices, can be formed or prepared by either directly growing on a suitable substrate (e.g., by metal organic chemical vapor deposition), or growing on a suitable substrate, detaching from the original substrate, and bonding to other substrates.

As used herein, two or more contacts or other items such as conductive channels or components are said to be "electrically connected" if they are connected by a material which is sufficiently conducting to ensure that the electric potential at each of the contacts or other items is intended to be the same, e.g., is about the same, at all times under any bias conditions.

As used herein, "blocking a voltage" refers to the ability of a transistor, device, or component to prevent significant current, such as current that is greater than 0.001 times the operating current during regular conduction, from flowing through the transistor, device, or component when a voltage is applied across the transistor, device, or component. In other words, while a transistor, device, or component is blocking a voltage that is applied across it, the total current passing through the transistor, device, or component will not be greater than 0.001 times the operating current during regular conduction. Devices with off-state currents which are larger than this value exhibit high loss and low efficiency, and are typically not suitable for many applications, especially power switching applications.

As used herein, a "high-voltage device", e.g., a high-voltage switching transistor, HEMT, bidirectional switch, or four-quadrant switch (FQS), is an electronic device which is optimized for high-voltage applications. That is, when the device is off, it is capable of blocking high voltages, such as about 300V or higher, about 600V or higher, or about 1200V or higher, and when the device is on, it has a sufficiently low on-resistance ($R_{ON}$) for the application in which it is used, e.g., it experiences sufficiently low conduction loss when a substantial current passes through the device. A high-voltage device can at least be capable of blocking a voltage equal to the high-voltage supply or the maximum voltage in the circuit for which it is used. A high-voltage device may be capable of blocking 300V, 600V, 1200V, 1700V, 2500V, 3300V or other suitable blocking voltage required by the application. In other words, a high-voltage device can block all voltages between 0V and at least $V_{max}$, where $V_{max}$ is the maximum voltage that can be supplied by the circuit or power supply, and $V_{max}$ can for example be 300V, 600V, 1200V, 1700V, 2500V, 3300V or other suitable blocking voltage required by the application. For a bidirectional or four quadrant switch, the blocked voltage could be of any polarity less a certain maximum when the switch is OFF ($\pm V_{max}$ such as $\pm 300V$ or $\pm 600V$, $\pm 1200V$ and so on), and the current can be in either direction when the switch is ON.

As used herein, a "III-N device" is a device based on or essentially including III-N materials, including III-N heterostructures. The III-N device can be designed to operate as a transistor or switch in which the state of the device is controlled by a gate terminal or as a two terminal device that blocks current flow in one direction and conducts in another direction without a gate terminal. The III-N device can be a high-voltage device suitable for high voltage applications. In such a high-voltage device, when the device is biased off (e.g., the voltage on the gate relative to the source is less than the device threshold voltage), it is at least capable of supporting all source-drain voltages less than or equal to the high-voltage in the application in which the device is used, which for example may be 100V, 300V, 600V, 1200V, 1700V, 2500V, or higher. When the high voltage device is biased on (e.g., the voltage on the gate relative to the source or associated power terminal is greater than the device threshold voltage), it is able to conduct substantial current with a low on-voltage (i.e., a low voltage between the source and drain terminals or between opposite power terminals). The maximum allowable on-voltage is the maximum on-state voltage that can be sustained in the application in which the device is used.

As used herein, a "III-polar" or "group-III polar" III-N material is a III-N material for which the group-III face (i.e., the [0 0 0 1] face) is opposite the substrate on which the material is grown. In a "III-polar" or "group-III polar" lateral III-N device, at least some of the device contacts (e.g., the source and/or drain contacts) are typically formed on a [0 0 0 1] face of the III-N material (e.g., on a side opposite the [0 0 0 -1] face).

As used herein, an "N-polar" III-N material is a III-N material for which the Nitrogen face (i.e., the [0 0 0 -1] face) is opposite the substrate on which the material is grown. In an "N-polar" lateral III-N device, at least some of the device contacts (e.g., the source and/or drain contacts) are typically formed on a [0 0 0 -1] face of the III-N material (e.g., on a side opposite the [0 0 0 1] face).

As used herein, a "regrown" III-N layer structure or III-N material structure, refers to an additional material deposition process which is performed after previous material deposition processes. Between subsequent growth and regrowth processes, the device can be unloaded from the deposition tool and the vacuum environment can be interrupted. As such, a regrown III-N material structure can require a separate insertion into the III-N material structure deposition equipment from the initial III-N material structure insertion. For example, a regrown III-N layer can be deposited after a removal of at least a portion of an initial III-N material structure. The removal of a portion of the initial III-N material structure typically occurs in an environment outside the primary III-N material structure deposition equipment.

The terms "over," "under," "between," and "on" as used herein refer to a relative position of one layer with respect to other layers. As such, for example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in contact with that second layer. Additionally, the relative position of one layer with respect to other layers is provided assuming operations are performed relative to a substrate without consideration of the absolute orientation of the substrate.

The details of one or more disclosed implementations of the subject matter described in this specification are set forth in the accompanying drawings and the description below. Additional features and variations may be included in the implementations as well. Other features, aspects, and advantages will become apparent from the description, the drawings and the claims.

DESCRIPTION OF DRAWINGS

FIG. 11A and FIG. 11B are cross-sectional views of two different embodiments of a hybrid III-N device, in each case incorporating a low voltage enhancement mode III-N module and a high voltage depletion mode III-N module.

FIG. 12 is a top-view of a first layout for the devices of FIGS. 2-6.

FIGS. 13A-E show a top-view of a second layout for the devices of FIGS. 2-6.

FIGS. 14A-B show a top-view of a third layout for the devices of FIG. 2-6.

DETAILED DESCRIPTION

Described herein are lateral III-N devices that have a vertical gate module, and in particular enhancement-mode (E-mode) III-N devices, for which the III-N material is orientated in an N-Polar or a group-III polar (e.g., a Ga-polar) orientation. Specifically, the channel of the device in the access regions conducts current in a lateral direction, while the channel of the device in a gate region conducts current in a substantially vertical direction when the device is biased ON.

Devices that function as a normally-off high voltage transistor can be realized by connecting a low-voltage E-mode FET and a high voltage D-mode FET in a cascode configuration. The low voltage E-mode FET can be either a discrete component (e.g., a silicon-based MOSFET) wire-bonded to a high-voltage D-mode III-N FET or a low voltage E-mode III-N device integrated monolithically with a high-voltage D-mode III-N device to create an integrated III-N device. In some cases, a monolithically integrated device on a single chip can be preferred to improve design flexibility, packaging, cost, and scalability to attain very high-power operations.

Figure 1A:
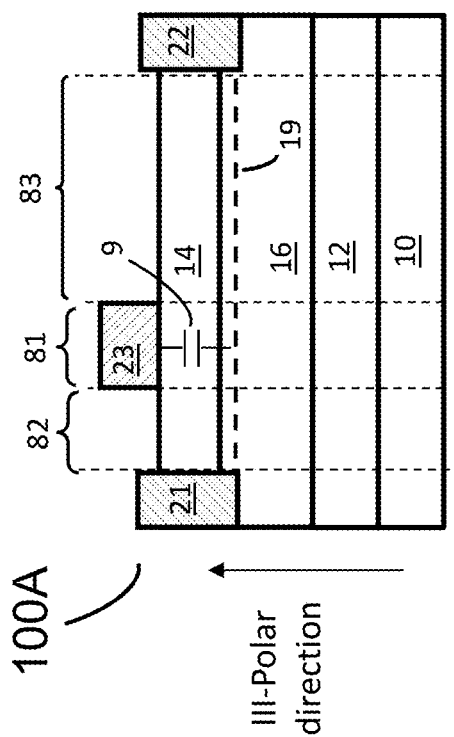
FIGS. 1A and 1B are cross-sectional views of III-N devices of the prior art.
Figure 1B:
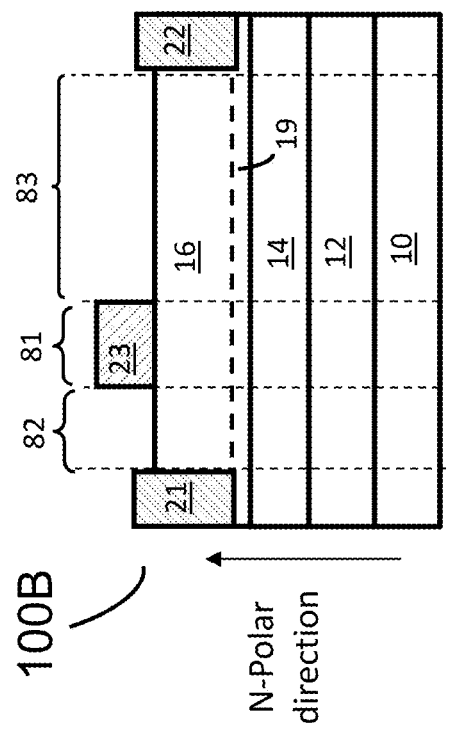

In both D-mode and E-mode III-N devices, the design of the gate module is critical to the device performance and reliability. The devices described herein incorporate gate modules that can ensure low on-resistance, stable threshold-voltages ($V_{TH}$), low gate-leakage, high breakdown voltages, and high short-circuit survivability. These requirements are not currently met to commercial satisfaction with conventional group-III polar lateral III-N device architectures. In conventional lateral III-N device architectures, the gate-module is formed over a thick (>500 nm) unintentionally doped (UID) GaN channel layer and an insulating or semi-insulating III-N (e.g., GaN) buffer layer (>2 µm). In these architectures, the potential of the device channel is controlled through the capacitive coupling of the gate contact to the device channel from the top side of the device, represented in FIG. 1A as capacitance 9. This coupling may not be sufficient to ensure reliable device operations under high-voltage and/or high-temperature conditions. Under high-voltage and/or high-temperature operation, the III-N material structure of the device can be susceptible to high electric field effects which cannot be controlled by conventional field-plating structures and can result in damage to the gate region of the device. These high electric field effects can include drain-induced barrier lowering (DIBL), impact ionization and hole generation, and fast or slow charge-trapping. These high electric field effects can result in undesirable effects such as threshold voltage instabilities, excessive leakage current, and premature device breakdown.

One way to reduce the high electric field effects is to introduce an additional field-plating structure buried in the gate region, in proximity to the back side of the device channel. This buried field-plating structure is referred to as the "body" layer, and is further described below in reference to FIG. 2. Due to the very high capacitive coupling between the body layer and the device channel, the field-plating of the gate region can be improved, reducing the impact from high-voltage operation. To maintain low capacitance between the drain and the source, as well as good switching performance, the body layer can be located only where strictly necessary, e.g., only in the vertical gate module.

Figure 2:
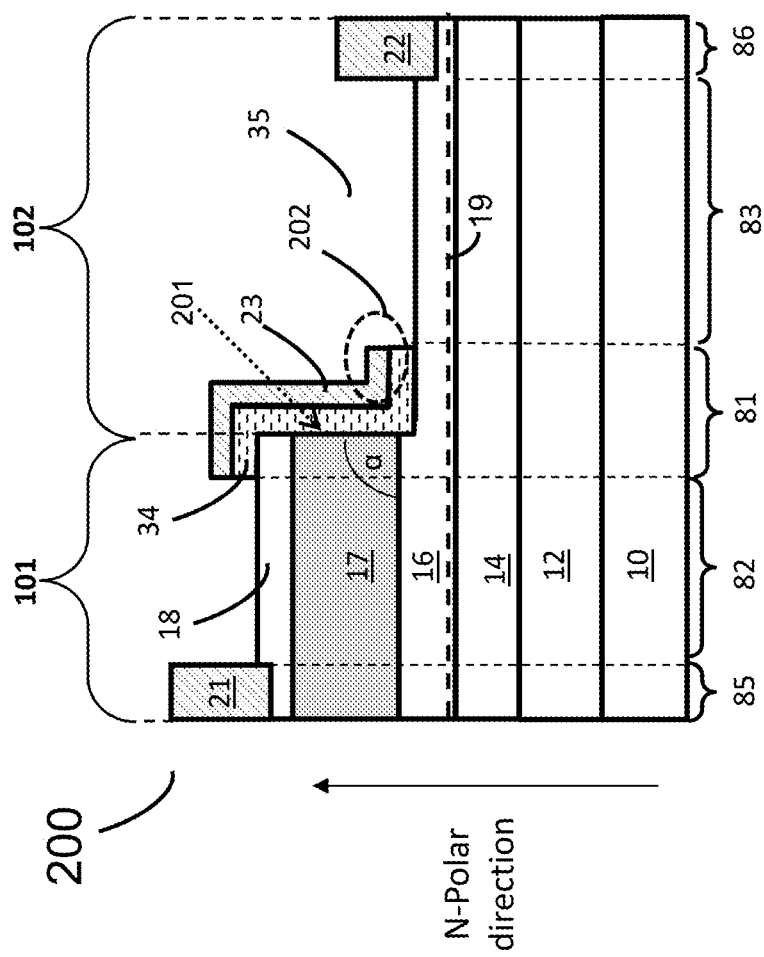
FIG. 2 is a cross-sectional view of a III-N device having an N-polar orientation and a vertical gate channel.

FIGS. 2-10 illustrate hybrid III-N devices that integrate a conventional lateral high-voltage gate module (low capacitance) with a vertical (or semi-vertical or slanted) gate module employing a protective body layer (e.g., a current blocking layer), which can here forth be referred to as Lateral Trench MOSFETs (i.e., LT-MOS). Referring to FIG. 2, an N-Polar III-N enhancement mode device 200 is shown. The III-N device 200 includes a III-N buffer layer 12, for example GaN or AlGaN, grown on a suitable substrate 10, which can for example be silicon (Si), silicon carbide (SiC), sapphire, AlN, or GaN. The substrate can be electrically conductive (e.g., p-type Si), electrically semi-insulating (e.g., SiC), or electrically insulating (e.g., sapphire). The substrate can have high thermal conductivity (e.g., SiC) or low thermal conductivity (e.g., sapphire); in the latter case, the substrate can be thinned to improve thermal dissipation. The substrate can have a similar or different lattice constant and/or thermal expansion coefficient than that of any of the material layers of the III-N structure. When the lattice constant and/or thermal expansion coefficient between the substrate and the III-N layers are different, a nucleation and/or stress-relief management layer can be introduced between the substrate 10 and the buffer layer 12 (not shown). The substrate 10 can be either floating (i.e., no fixed potential) or grounded (i.e., the substrate potential is fixed at the same voltage of the source). In some implementations the substrate 10 may be omitted.

The buffer layer 12 can be rendered insulating or substantially free of unintentional n-type mobile carriers by including dislocations or point defects in the layer, or by doping the layer with compensating elements, such as Fe, C, and/or Mg. The buffer layer can have a substantially uniform composition throughout, or the composition can vary. For example, in some implementations the buffer layer is compositionally graded, such as by grading the aluminum composition along a vertical axis in the buffer layer. The buffer layer 12 can be substantially thicker than any of the other III-Nitride layers in the structure. For example, buffer layer 12 may have a thickness that is at least 10 times, but typically at least 30 times, the combined thickness of the III-N layers between buffer layer 12 and the gate 23.

The III-N device 200 further includes a III-N back-barrier layer 14, for example $Al_xGa_{1-x}N$, over the III-N buffer layer 12, and a III-N channel layer 16, for example unintentionally doped (UID) GaN, over the III-N back-barrier layer 14. The bandgap of the III-N back-barrier layer 14 is greater than that of the III-N channel layer 16. The III-N channel layer 16 has a different composition than the III-N back-barrier layer 14, and the thickness and composition of each of the III-N back-barrier layer 14 and III-N channel layer 16 is selected such that a conductive layer of electrons is induced in the III-N channel layer 16. The interface between the III-N back-barrier layer 14 and the III-N channel layer 16 can be abrupt. In that case, a conductive two-dimensional electron gas (2DEG) channel 19 (indicated by the dashed line in FIG. 2) is induced in the III-N channel layer 16 adjacent the interface between layers 14 and 16. The composition of the III-N back-barrier layer 14 and III-N channel layer 16 can be constant or can be varied throughout. For example, the layer 14 can have a first portion that is a graded AlGaN portion with an increasing Al concentration (for example with the lowest Al concentration on the side nearest the substrate), and a second AlGaN portion that has a constant Al concentration. In another example, the III-N back barrier layer has a first portion that is n-type GaN or AlGaN and a second portion that is undoped AlGaN. The III-N back barrier layer 14 can include a first portion (near the substrate) that is an n-type III-N portion, a second portion over the first portion that is a graded III-N portion (e.g., the aluminum composition is graded) and a third portion over the second portion that has a constant composition. Furthermore, the graded portion or the n-type portion of the III-N back-barrier layer 14 can be doped with Si or any other dopant that prevents the formation of holes. The doping concentration per unit area can be in a range of 1e11 donors/cm² to 1e14 donors/cm². Preferably, the doping concentration is selected such that the magnitude is similar to (e.g., within 50% of) the areal polarization charge concentration in the III-N back-barrier layer 14.

The different portions of the III-N back barrier layer 14 can act to prevent the formation of a parasitic two-dimensional hole-gas near the bottom of the back-barrier layer. For example, if holes accumulate near the bottom of the back-barrier, the device may suffer from parasitic leakage current and threshold voltage instabilities due to hole-trapping. If the doping of the layer is too low, parasitic hole accumulation can occur; however if the doping is too high, parasitic electron accumulation can occur near the bottom of the back-barrier layer 14.

The back-barrier layer 14 can have a thickness between 5 nm and 50 nm. The back-barrier layer 14 can have a thickness greater than 20 nm. The channel layer 16 can have a thickness between 2 nm and 300 nm. The channel layer 16 can have a thickness that is greater than 20 nm. In addition, a 0.5-5 nm AlN interlayer (not shown) can be disposed between the barrier layer 14 and the channel layer 16. This AlN interlayer can help to increase the polarization charge and reduce electron scattering at the interface between the III-N back-barrier layer 14 and the III-N channel layer 16, improving the 2DEG channel sheet-resistance.

In another example, a portion of the III-N channel layer 16 can have bulk n-type conductivity generated through either impurity doping (e.g., silicon incorporation) and/or polarization-doping. To achieve polarization-doped n-type conductivity, the composition of the III-N channel layer 16 is graded such that the gradient of the polarization field is negative in the [000-1] direction. For example, the III-N channel layer 16 in the III-N device 200 can be formed of $Al_yGa_{1-y}N$ (0≤y≤1), where y is equal to the y in the III-N back-barrier layer 14 and decreases (e.g., continuously decreases) from the side adjacent the III-N back-barrier layer 14 to the side opposite the III-N back-barrier layer 14. Alternatively, the III-N channel layer 16 can be formed of $In_zGa_{1-z}N$ (0≤z≤1), where z increases (e.g., continuously increases) from the side adjacent the III-N back-barrier layer 14 to the side opposite the III-N back-barrier layer 14.

A III-N body layer 17 is formed over at least a portion of the III-N channel layer 16. As shown in FIG. 2, the III-N body layer 17 can be over the channel in a laterally extending region between a gate contact 23 and the source contact 21, but not between the gate contact 23 and the drain contact 22. As a result, the III-N body layer 17 is at least over the III-N channel layer 16 in the source side access region 82 but not over the III-N channel layer in the drain side access region 83. For example, the III-N body layer 17 can be formed over the entire III-N channel layer and then removed (e.g., by dry and/or wet etching) everywhere except between where the gate contact 23 and the source contact 21 are subsequently deposited.

The III-N body layer 17 can be a p-type doped III-N layer (e.g., p-GaN). The p-type doped III-N body layer 17 can be doped with an active acceptor concentration density greater than $1 \times 10^{16}$ cm$^{-3}$ and lower than $2 \times 10^{20}$ cm$^{-3}$, for example greater than $1 \times 10^{18}$/cm$^{-3}$ such that it is not fully depleted when the drain is biased at or below the maximum rated voltage of the device. If the III-N body layer 17 is p-type GaN doped with Mg, the device can be treated with high temperature annealing to render Mg dopants electrically active, and have a p-type doping concentration lower than $2\times10^{19}$ cm$^{-3}$ to avoid excessive incorporation of impurities (such as carbon and hydrogen) and to reduce electron scattering. In addition, a 0.5-5 nm AlGaN or AlN interlayer (not shown) can be disposed between the III-N body layer 17 and the channel layer 16. This AlGaN or AlN interlayer can help prevent undesired Mg diffusion from the Mg-doping of the p-type III-N body layer into the III-N channel layer 16. This AlGaN or AlN interlayer can also serve as selective etch stop-layer to improve the control and the accuracy of the etching process used to remove the III-N body layer 17 in the drain side access region. The III-N body layer 17 can have a thickness between 20 nm and 5 μm. The III-N body layer 17 can have a thickness greater than 50 nm. The III-N body layer 17 can have a thickness greater than 200 nm.

Additionally, while in some cases the entire layer 17 is doped p-type, in other cases only a portion of the layer is doped p-type. For example, the layer 17 can include a series of p-doped portions in the vertical direction, each separated by undoped portions. When the III-N body layer 17 is doped p-type, the body layer will deplete out the electrons in the vertical channel in the gate region 81, thus causing the threshold voltage of the device to be positive. A positive voltage (with respect to the source contact) must be applied to the gate contact in order to connect the source contact to the 2DEG channel, therefore achieving E-mode operation mode. In addition, when the p-type doped body layer is electrically connected to the source contact 21, the source potential (i.e., the ground plane) can be very close (e.g., less than 20 nm) to the vertical channel. As such, the body layer 17 functions as a buried source-connected field plate structure, thus shielding the gate region from high-voltage stress, mitigating short-channel effects such as drain induced barrier lowering (i.e., DIBL) and suppressing $V_{TH}$ instabilities. The p-type body can collect holes generated in the high-voltage section of the III-N device preventing them from being trapped under the gate, reducing $V_{TH}$ instabilities. The p-type body can also enable the design and integration of electrostatic discharge (ESD) protection structures, which can improve device reliability.

Alternatively, the p-type of the III-N body layer 17 can be achieved by polarization-induced doping (e.g., by grading the bandgap of the layer without introducing any dopant impurities). In this case, an aluminum or indium composition of the III-N body layer 17 is graded to induce a bulk negative polarization-charge which can attract holes, rendering the III-N body layer 17 p-type. A graded III-N body layer 17 has a composition that is graded (e.g., continuously graded), from the side adjacent the III-N channel layer 16 to the side opposite the III-N channel layer 16. The composition of a graded p-type III-N body layer 17 is selected such that the gradient of the polarization field is positive in the [000-1] direction. For example, the III-N body layer 17 in the III-N device 100 can be formed of Al$_y$Ga$_{1-y}$N (0≤y≤1), where y is equal to they of the III-N channel layer 16 and increases (e.g., continuously increases) from the side adjacent the III-N channel layer 16 to the side opposite the III-N channel layer 16. Alternatively, the III-N body layer 17 can be formed of In$_z$Ga$_{1-z}$N (0≤z≤1), where z decreases (e.g., continuously decreases) from the side adjacent the III-N channel layer 16 to the side opposite the III-N channel layer 16.

Alternatively, the III-N body layer 17 can be formed using a semi-insulating or insulating GaN layer (e.g., i-GaN). The i-GaN layer can be rendered semi-insulating, insulating or substantially free of n-type mobile carriers by including dislocations or point defects in the layer, or by doping the layer with compensating elements, such as Fe and/or C. The implementation of an i-GaN body layer instead of a p-type GaN body layer can simplify the fabrication process because there is no need to control the Mg doping profile and the Mg activation of a p-type GaN body layer or the grading profile. However, because of the insulating nature of the i-GaN body, an electrical connection to the source contact cannot be used to control the voltage potential of the body layer 17, and hence an i-GaN body may not provide the same benefits in terms of threshold voltage and field-plating when compared to the implementation of the p-type III-N body layer.

A III-N capping layer 18, for example an n-type GaN layer, is formed over the III-N body layer 17 between the gate 23 and the source 21. The III-N capping layer provides a current path in the source side access region 82 between the source contact 21 and the gate region 81. The thickness of the III-N capping layer can be between 10 nm and 1 μm. The III-N capping layer can have a thickness greater than 10 nm. The III-N capping layer 18 can be doped with silicon (donor). The doping concentration of the III-N capping layer can be high enough to yield an electron concentration density greater than $1\times10^{16}$ cm$^{-3}$. The thickness and net n-type doping of the III-N capping layer 18 can be sufficiently high such that layer 18 is not fully depleted of free electrons by the III-N body layer 17, for example thickness can be greater than 50 nm and average n-type doping greater than $1\times10^{18}$ cm$^{-3}$. The n-type doping can be greater than $1\times10^{19}$ cm$^{-3}$.

The thickness and n-type doping of the III-N capping layer 18 can be sufficiently high to yield very low sheet-resistance. The sheet-resistance of the III-N capping layer 18 can be lower than 100-200Ω/□. The sheet-resistance of the III-N capping layer 18 can be lower than the sheet-resistance of the III-N channel layer 16. This represents an unusual advantage of this device architecture: the source side access region 82 is realized on a fully independent layer with respect to the drain side access region 83. Therefore, the III-N capping layer 18 in the source side access region can be engineered to attain very small source access resistance, yielding lower device on-resistance, without compromising the electric field-management of the high-voltage section in the drain side access region 83 of the device. Traditional lateral device architectures have not been able to incorporate this feature, where the sheet resistance in the source side access region is lower than compared to the sheet resistance in the drain side access region.

The III-N capping layer 18 and III-N body layer 17 are removed in a portion of the gate region 81 and in the drain side access region 83 to create a vertical (or semi-vertical or slanted) gate module. The removal of the III-N material structure in these regions can herein be referred to as a "trench recess" indicated as area 35. The process of forming the trench recess 35 can be optimized to minimize damage to the surfaces of the exposed III-N materials in the gate region 81, and drain side access region 83. The selective removal process can be carried out by means of dry-etch techniques (e.g., RIE or ICP) using unselective etch agents (e.g., Cl$_2$, BCl$_3$/Cl$_2$) or selective etch agents (e.g., SF$_6$, BCl$_3$/SF$_6$). The removal of the III-N capping layer 18 and III-N body layer 17 can be carried out by means of wet-etch techniques. The removal of the III-N capping layer 18 and III-N body layer 17 can be carried out by a combination of dry-etch and wet-etch techniques. For example, a low-power dry-etch can be used to remove the bulk of the III-N capping layer 18 and III-N body layer 17, followed by an acid wet-etch treatment to remove a remaining portion of the III-N material structure.

The process of removing the III-N body layer 17 can involve the partial removal of the III-N channel layer 16. The partial removal of the III-N channel layer 16 can be carried out by over-etching of the III-N body layer in a continuous dry etching step, or carried out by a combination of multiple dry and wet etching steps. The remaining thickness of the III-N channel layer 16 determines the capacitance between the channel (e.g., 2DEG) and the foot of the gate contact. The foot of the gate contact is indicated by the dashed region 202, in FIG. 2 and defined as the portion of the gate contact which is closest to the III-N channel layer 16 and parallel to the 2DEG channel 19. The foot of the gate contact functions as a gate-connected field-plate at the base of the lateral device section 102, therefore determining the pinch-off voltage of the 2DEG channel in the gate region 81. Before the trench etch processing, the III-N channel layer 16 can be, for example, thicker than 150 nm. In the region where the III-N body layer 17 has been removed, the overetch of the III-N channel layer can be 20-100 nm. In the region where the III-N body layer 17 has been removed, the thickness of the III-N channel layer 16 remaining can be greater than 50 nm. More than 50% of the thickness of III-N channel layer can be removed during the overetch process of the III-N body layer 17.

In another example, the III-N body layer 17 can be selectively regrown only in the source and gate regions 85, 82, and 81. The selective regrowth of the III-N body layer 17 can be realized by means of dielectric-based hard mask. The selective growth III-N body layer 17 can have the advantage of maintaining a high-quality gate sidewall 201 and on the surface of the III-N channel layer 16 in the drain side access region 83, free from etch damage. A substantially vertical sidewall 201 (i.e., not parallel to the substrate) is formed at a non-zero angle along the drain-side edge of the III-N body layer 17 having a slope at an average angle α relative to a top surface of the III-N channel layer 16, where the top surface of the III-N channel layer is opposite the substrate 10. A vertical device section 101 and a lateral device section 102 are formed in the device 200 as defined by the vertical sidewall 201 of the III-N body layer 17 in the gate region 81. The gate-length ($L_G$) of the device is defined by the thickness of the III-N body layer 17 divided by the sine of the angle α. As seen in FIG. 2, the angle α is approximately 90° (e.g., between 80°-90°). However, as shown in later embodiments, the sidewall 201 of the III-N body layer 17 can be slanted at an angle α<90°, for example between 20°-80° relative to the top surface of the III-N channel layer 16 (e.g., relative to the lateral 2DEG channel formed in the III-N channel layer). Although not clearly indicated in FIG. 2 due to scale, the length of the gate contact 23 which is parallel to the side wall 201 is at least equal to or greater than the thickness of the III-N body layer 17 divided by the sine of the angle α.

The III-N layers 12, and 14, 16, 17, and 18 are N-polar III-N layers, orientated as shown in the [0 0 0 −1] direction which form an N-Polar III-N material structure. The N-polar (i.e., N-face) III-N material structure can be prepared either by (i) directly growing N-polar III-N layers on a suitable substrate such as silicon, Silicon Carbide (SiC), sapphire, Aluminum Nitride (AlN), or Gallium Nitride (GaN), by exposing the substrate surface to nitridation to promote the nucleation of N-polar III-N epitaxy, (ii) by growing an initial III-polar layer and inverting the crystal orientation from III-polar to N-polar with the insertion of a thin (e.g., less than 300 nm) III-N layer with very high magnesium doping (e.g., greater than $1\times10^{20}$ cm$^{-3}$) such that the subsequently grown layers are N-polar oriented, (iii) by growing an initial III-polar layer and inverting the crystal orientation from III-polar to N-polar with the insertion of a thin (e.g., less than 20 nm) $Al_2O_3$ layer and exposing the surface to nitridation to promote the subsequent growth of N-polar epitaxy such that the subsequently grown layers are N-polar oriented or (iv) by growing the layers in reverse order in a group-III polar orientation and then accessing an N-face of the III-N material structure from the reverse side of the direction of growth, for example by removing the growth substrate and optionally by removing a portion of the III-N material that was directly adjacent to the growth substrate.

A gate insulator layer 34 (e.g., a gate dielectric layer), is grown or deposited, at least in the gate region 81, conformally over the vertical sidewall 201 of the III-N body layer 17. The gate insulator layer 34 can be over the top surface of the III-N capping layer 18 and have a first portion which extends towards the source 21. The gate insulator 34 can be over the top surface of the III-N channel layer 16 and have a second portion which extends towards the drain 22. Alternatively, the gate insulator layer 34 can extend continuously between the source contact 21 and the drain contact 22 (not shown), such that the entire top surface of the III-N material structure is passivated by the insulator layer.

The gate insulator 34 can, for example, be formed of or include aluminum oxide ($Al_2O_3$), silicon dioxide ($SiO_2$), silicon nitride ($Si_xN_y$), $Al_{1-x}Si_xN$, $Al_{1-x}Si_xO$, $Al_{1-x}Si_xON$ or any other wide bandgap insulator. In some examples, the gate insulator 120 is an $Al_{1-x}Si_xO$ layer, e.g., an amorphous $Al_{1-x}Si_xO$ layer or a polycrystalline $Al_{1-x}Si_xO$ layer, where x and (1−x) represent the relative fractional compositions of non-oxygen elements in the $Al_{1-x}Si_xO$ layer. That is, (1−x) is the percent of non-oxygen elements in the $Al_{1-x}Si_xO$ layer that are constituted by aluminum, x is the percent of non-oxygen elements in the $Al_{1-x}Si_xO$ layer that are constituted by silicon, and (1−x)/x is the ratio of aluminum to silicon in the $Al_{1-x}Si_xO$ layer. For example, the gate insulator layer 34 can be an amorphous $Al_{1-x}Si_xO$ layer that provides high threshold voltage and low gate leakage. In some implementations, an $Al_{1-x}Si_xO$ layer also includes a low concentration of nitrogen. That is, during the formation of $Al_{1-x}Si_xO$ layer, a low concentration of nitrogen can be incorporated into the layer, wherein the nitrogen concentration is substantially lower than the concentrations of the primary elements (for example, Al, Si, and O for a $Al_{1-x}Si_xO$ layer). Preferably, the dielectric material of the gate insulator layer 34 has a high density which is more immune to mobile ion drift (more stable $V_{th}$) and inhibits the formation of traps. An $Al_{1-x}Si_xO$ gate insulator layer can have improved enhancement mode device characteristics compared to other gate insulator layers, for example SiN, $Al_2O_3$, $SiO_2$, or $Al_{1-x}Si_xN$. The gate insulator 34 can have a thickness of between about 1 nm and 100 nm, for example between 10 nm and 60 nm. The gate insulator can be deposited either ex-situ, (e.g., with a different tool than that used for the growth of underlying III-N material), or in-situ, (i.e., with the same tool and during the same growth session used to growth the underlying III-N material). In case of in-situ deposition, the device surface is not exposed to air, thus not exposed to oxidizing elements (e.g., oxygen) and undesired impurities/contaminates. For this reason, in-situ deposition can result in superior interface qualities compared to ex-situ deposition (e.g., lower scattering, higher mobility, lower charge-trapping effects, more stable VTH) resulting in superior electrical performance.

A gate contact 23 (i.e., gate electrode) is formed conformally over the gate insulator layer 34 and the vertical sidewall portion of the III-N body layer 17. The gate contact 23 can be over the top surface of the III-N capping layer 18 and have a first portion which extends towards the source 21. The gate contact 23 can be over the top surface of the III-N channel layer 16 and have a second portion which extends towards the drain 22 with similar or different lengths as the first and second extending portions of the gate insulator layer 34. The second portion of the gate contact 23 can be longer than the first portion. The second portion of the gate contact 23 which extends towards the drain is referred to as the foot of the gate contact, and is indicated by the dashed region 202 in FIG. 2. The second portion acts as the first field plate of a gate-connected field plate structure. The length of the second portion of the gate contact 23 in region 202 can be critical to device performance and impact the break down voltage and long term reliability of the device.

The gate contact 23 can be formed of suitable conducting materials such as metal stacks, e.g., aluminum (Al), titanium/aluminum (Ti/Al) or nickel/gold (Ni/Au), and can be deposited by metal evaporation or sputtering or chemical vapor deposition or various atomic layer depositions (ALD). The gate contact 23 may alternatively be another conductive material or material stack including one or more materials having a large work function, such as a semiconductor material having a large work function (e.g., p-type polysilicon, indium tin oxide, tungsten nitride, indium nitride, or titanium nitride). A post-gate deposition annealing process may optionally be performed after deposition of the gate contact 23. The post-gate deposition anneal may be performed in a gas ambient including oxygen or a forming gas ($H_2+N_2$). The post gate deposition anneal temperature can be greater than 300° C., or greater than 400° C. Finally, the gate contact 23 can be used as an etch mask to etch the gate insulator layer 34, such that the gate insulator layer 34 remains directly beneath the gate contact 23 but is etched away, or partially etched away (not shown), everywhere else.

Source and drain contacts 21 and 22 (i.e., source and drain electrodes), respectively, are on opposite sides of the gate contact 23. The source contact 21 is formed over the III-N capping layer 18. The source contact 21 can be in ohmic electrical contact with the III-N capping layer 18 to provide current during the on-state, and the source 21 can make an electrical connection with the III-N body layer 17. The source contact 21 (i.e., source electrode) is electrically isolated from the 2DEG channel when the gate electrode is biased relative to the source electrode at a voltage that is below a threshold voltage of the device. When the source contact makes an electrical connection to the III-N body 17, the III-N body layer 17 is held at the same voltage as the source, maximizing the benefit of the buried field-plating effects of the III-N body layer 17, as previously described. In addition, charging and discharging of the reactive elements of the gate-module during switching operations can be improved.

The electrical connection to the III-N body layer 17 can be implemented by using different methods. A first method includes forming a recess into the III-N capping layer 18 sufficiently deep as to allow at least a portion of the source contact to be in direct contact with the III-N body layer 17 (not shown). The recess forming can be carried out by dry-etch and/or wet-etch processes. For example, the recess can be fully realized by means of dry-etch techniques or a combination of dry-etch and wet-etch techniques. For example most of the III-N capping layer 18 can be removed by dry-etch and a remaining portion of the III-N capping layer 18 can be removed by wet-etch techniques. The wet-etch can be used to ensure that the surface of the III-N body layer 17 is smooth and free from dry-etch damage. After the source contact recess in the III-N capping layer is formed, a high temperature anneal can be performed to improve the morphology and the composition of etched surface. High temperature annealing can be carried out in nitrogen/oxygen ($N_2/O_2$), nitrogen/ammonia ($N_2/NH_3$), forming gas ($N_2/H_2$). Temperature can range between 300 C to 1000 C, preferably between 700 C to 900 C. A body metal stack can be deposited to make physical ohmic contact to the III-N body layer 17 in the recess. The body metal stack can be a high work function metal to ensure ohmic contact to the III-N body layer 17 (e.g., Al, Ti/Al, Pd, Pt, Ni/Au or the like). The contact between the body metal and the III-N body layer 17 can be improved by introducing a thin highly doped p-type layer (e.g., between 2 nm and 50 nm thick with a doping density greater than $5\times10^{19}$ cm$^{-3}$) at the top of the III-N body layer 17. After the body metal stack is formed, the source contact metal is deposited over the body metal stack to ensure ohmic contact to the III-N capping layer 18. The source metal-stack can be Al, Ti/Al, Ti/Al/Ni/Au, Ni/Au or the like.

If the source contact 21 is not in physical contact with the III-N body layer 17 (as shown in FIG. 2) through a recess in the III-N capping layer 18, an electrical connection between the source contact 21 and the III-N body layer 17 can be implemented with a tunnel junction contact between the III-N body layer 17 and the source contact 21. The tunnel junction contact can be formed by introducing a highly doped p-type GaN region (i.e., p++ GaN) at the top surface of the III-N body layer 17 (e.g., between 2 nm and 50 nm thick with a doping density greater than $5\times10^{19}$ cm$^{-3}$) and a highly doped n-type GaN region (i.e., n++ GaN) at the bottom surface of the III-N capping layer 18 (e.g., between 2 nm and 50 nm thick with a doping density greater than $5\times10^{19}$ cm$^{-3}$). The doping density of the highly doped regions should be such that the depletion width at the junction formed between the III-N capping layer 18 and the III-N body layer 17 is not more than a few nanometers (e.g., less than 10 nm), thus comparable to electron tunneling distance. Here, electrons can tunnel from the conduction-band of the III-N capping layer 18 and recombine with holes in the valence-band of the III-N body layer 17, creating an electrical connection between the source contact 21 and the III-N body layer 17.

Figure 15B:
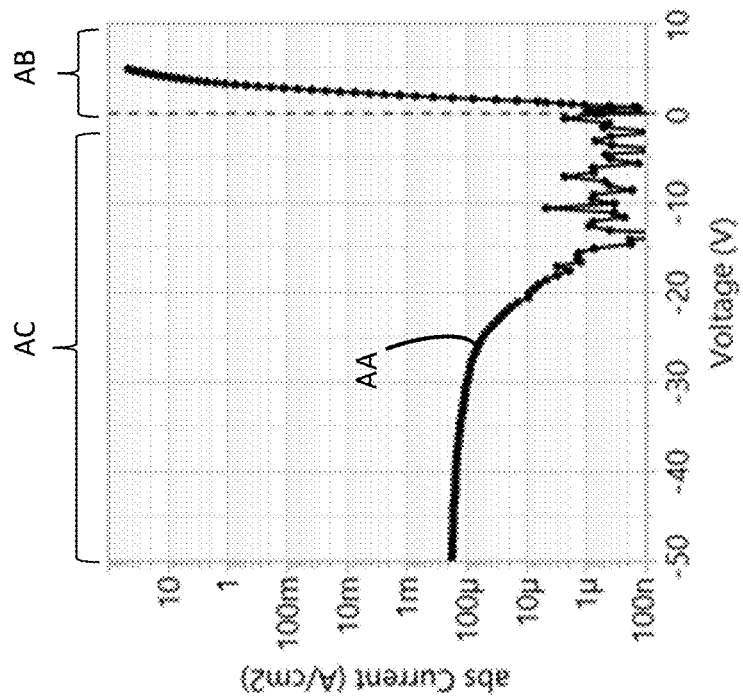
FIGS. 15B-D show current-voltage curves detailing the characteristics of a tunnel junction contact
Figure 15A:
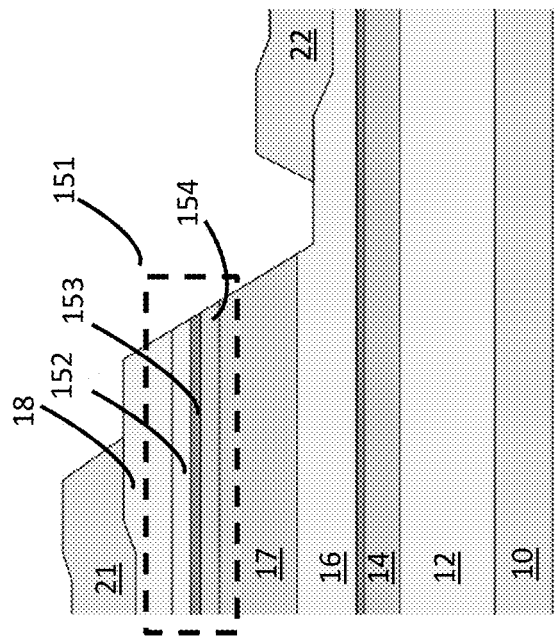
FIG. 15A is a detailed cross sectional view of the material layer structures forming a tunnel junction.

Although not shown in FIG. 2, the quality of the tunnel junction in N-polar III-N materials can further be improved, e.g., as shown in FIG. 15A, by inserting a thin $Al_yGa_{1-y}N$ ($0<y\leq1$) layer between the III-N body layer 17 and the III-N capping layer 18 (such that the interface region is p++ GaN/$Al_yGa_{1-y}N$/n++ GaN). In N-polar III-N materials, the polarization charge of the inserted thin $Al_yGa_{1-y}N$ layer further increase the accumulation of holes at the interface with the III-N body layer 17 and of electrons at the interface with the III-N capping layer 18, facilitating tunneling and recombination processes. The thickness of the thin $Al_yGa_{1-y}N$ layer can be between 0.5 nm to 5 nm, preferably between 0.5 nm and 2 nm, to facilitate tunneling. The thin $Al_yGa_{1-y}N$ layer can also act to suppress the diffusion of the Mg (p-type dopant) in the III-N body layer 17 to the III-N capping layer 18, resulting in sharper doping profile and improved junction between the III-N body layer 17 and the III-N capping layer 18. Preferably, the thin $Al_yGa_{1-y}N$ layer has high aluminum composition to (i) improve the Mg diffusion barrier, and (ii) increase the polarization charge and the accumulation of carriers at the tunnel junction resulting in better tunnel junction contact resistance. The aluminum composition (y) can be greater than 50% (i.e., y>0.5). In addition, a thin layer of $In_zGa_{1-z}N$ (0<z≤1) can be inserted between the $Al_yGa_{1-y}N$ layer and the n++ layer at the bottom of the III-N capping layer 18 can be used to further improve electron accumulation at the tunnel junction interface. The indium composition in the $In_zGa_{1-z}N$ (0<z≤1) layer can be greater than 5% (i.e., z>0.05). The source contact metal stacks can be Al, Ti/Al, Ti/Al/Ni/Au, or the like. The source contact 21 can be formed by metal evaporation and post-deposition annealing processes. Other ohmic contact processes can also be used including sputtering and dry etch processing. Furthermore, a combination of the first and second method can be used to create the source connection to the III-N material structure, where the source contact metal layer is in physical contact with the III-N body layer 17, and a tunnel junction is formed through the sidewall connection of the source metal 21 in the recess of the III-N capping layer 18.

The drain 22 contacts the device 2DEG channel 19 that is formed in layer 16. The drain contact 22, e.g., a drain electrode, can be formed by metal stacks. The drain 22 contacts the channel layer 16. A recess can be at least partially formed in the III-N channel layer 16 to allow for improved contact of the drain electrode to the 2DEG channel 19. A portion of the channel layer 16 in a drain region 86 can be doped n-type, or an additional n-type layer can be inserted between the drain contact and the channel layer 16 to improve the contact of the drain metal to the 2DEG. The metal stacks can be Al, Ti/Al, Ti/Al/Ni/Au, or the like. The drain contact 22 can be formed by metal evaporation and post-deposition annealing processes. Other ohmic contact processes can also be used including sputtering and dry etch processing.

The portion of the III-N material structure below the gate contact 23, in region 81, is referred to as the gate region of the device. The portions of the III-N material structure directly below the source and drain 21 and 22, regions 85 and 86, are respectively referred to as the source and drain regions of the device. The portions of III-N material between the gate region 81 and the source region 85, and between the gate region 81 and the drain region 86, are referred to as the device access regions, where region 82 is the source side access region and region 83 is the drain side access region.

The material properties of the III-N material structure of FIG. 2 can be selected to ensure that the device is an enhancement-mode device, such that the device has a threshold voltage greater than 0V, for example greater than 2V or greater than 5V. That is, when 0V is applied to the gate 23 relative to the source 21 and a positive voltage is applied to the drain 22 relative to the source 21, channel charge in the gate region is depleted such that the source 21 is electrically isolated from the 2DEG channel 19, and the device is in a non-conductive state. The III-N body layer 17 can be a current blocking layer, such that the current blocking layer separates the source contact from the 2DEG channel when the device is biased below the threshold voltage. When a sufficiently positive voltage higher than the threshold voltage is applied to the gate 23 relative to the source 21, a channel charge in the gate region is induced, and the device becomes conductive between the source 21 and the drain 22, as described in further detail below.

Figure 3:
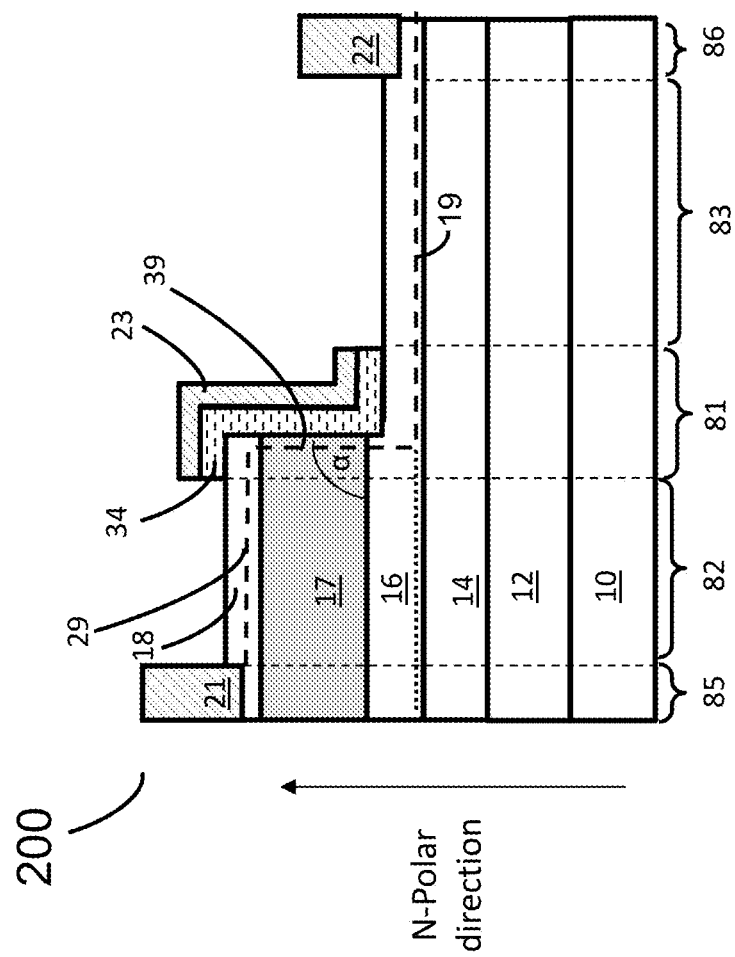
FIG. 3 illustrates the current conduction channel of the III-N device of FIG. 2 when the gate is biased in the ON state.

FIG. 2 depicts the III-N device 200 in an unbiased state (i.e., when there is no voltage applied to the device electrodes) and the 2DEG channel extends continuously through the III-N channel layer 16, but a conductive channel does not extend continuously from the source 21 to the drain 22. Next, FIG. 3 depicts the III-N devices 200 biased in an ON state (i.e., when the gate 23 is biased above the threshold voltage of the device), and a conductive channel extends continuously from the source 21 to the drain 22. The III-N device 200 operates as follows: when the gate contact 23 is biased relative to the source 21 at a voltage that is greater than the threshold voltage of the device, an inversion channel 39 forms at the vertical interface between the gate insulator layer 34 and the III-N body layer 17 in the gate region 81 of the device, thereby electrically connecting the source contact 21 to the 2DEG channel 19. When a positive voltage is applied to the drain 22, electrons flow from the source 21, through a source side channel 29 which is present in the conductive n-type III-N capping layer 18, through the inversion channel 39 formed near the vertical interface between the gate insulator layer 34 and the III-N body layer 17 in the gate region 81, into the 2DEG channel 19, and to the drain 22 forming a continuous device channel between the source contact 21 and the drain contact 22. A conventional current flows from the drain 22 to the source 21, and the device is considered to be ON.

When the gate 23 is biased relative to the source 21 at a voltage that is lower than the threshold voltage of the device, the p-type dopants of the III-N body layer 17 fully deplete the charge between the vertical interface between of the gate insulator layer 34 and the III-N body layer 17 such that there is no inversion channel formed in the gate region 81 and therefore the device channel is discontinuous between the source contact 21 and the 2DEG channel 19. Furthermore, when a positive voltage is applied to the drain, the 2DEG channel 19 in the III-N channel layer 16 will become depleted (i.e., pinched-off). The drain-bias required to pinch-off the 2DEG in the gate-region 81 is set by capacitive coupling between the 2DEG channel and the foot of the gate (region 202), which acts as a gate-connected field-plate. The capacitance between the 2DEG and the foot of the gate region 202 can be tailored by the thickness of III-N channel layer 16 under the gate-foot metal and the thickness and dielectric constant of the gate oxide layer under the gate-foot metal. These components can be designed such that the minimum drain bias voltage required to fully deplete (pinch-off) the 2DEG in the gate region 81 can be relatively low (e.g., less than 30V). The minimum voltage required to fully deplete the 2DEG channel 19 in the gate region 81 represents the maximum voltage that the gate module of the device is exposed to during device operation. As the drain-bias is further increased beyond the pinch-off voltage of the 2DEG in the gate-region 81, the depletion of the 2DEG further extends into the drain side access region 83. The depletion region starts in the source side access region 82 at low drain voltages and expands gradually towards the drain side access region 83 as the drain voltage is increased. This results in a low stress on the gate region 81, enhanced $V_{TH}$ stability, and very low DIBL.

Once the 2DEG is fully depleted in the source side access region, any additional voltage applied to the drain is held entirely by the lateral portion of the drain side access region. The lateral portion of the drain side access region can be constructed using field plates and/or charge-balancing structures to withstand high voltages, for example greater than 200V, greater than 300V, greater than 600V, greater than 900V, greater than 1200V, greater than 3300V, or greater than 10 kV. The high voltage held by the lateral portion of the drain side access region 83 does not affect the gate region

81. When the substrate is grounded, the maximum voltage experience by the III-N body layer 17 is the low voltage required to pinch-off the 2DEG in the source side access region 82 (e.g., less than 30V). When the substrate is floating (i.e., when the substrate potential is not fixed by any external voltage source, but it is internally determined by the capacitive coupling with the source and the drain), the III-N body layer in the source side access region 82 can be exposed to additional voltages. As such the doping and the thickness of the III-N body layer 17 can be configured to withstand high voltages, for example, voltages greater than 300V, greater than 600V, or greater than 900V. The doping and thickness of the III-N body layer 17 can be configured such that the III-N body layer 17 does not fully deplete when exposed to off-state high-voltage in a floating substrate configuration.

The III-N device 200 can be a transistor, a bidirectional switch or four quadrant switch (FQS), and/or any suitable semiconductor device. Traditional III-N devices with a lateral 2DEG gate region typically exhibit a shift in threshold voltage (Vth) after being stressed under continuous use, as previously described. However, in the device 200 of FIG. 2, the use of the III-N body layer 17 can reduce the $V_{TH}$ shift of the device closer to 0V, when compared to a traditional lateral III-N device without the a III-N body layer.

Furthermore, when the gate 23 is biased relative to the source 21 at a voltage that is lower than the threshold voltage of the device, and a sufficient reverse (i.e., positive) voltage bias is applied to the source contact relative to the drain contact, a body diode is formed between the III-N body layer 17 and the III-N channel layer 16, and current can flow through the body diode in the reverse direction from the source contact 21 to the drain contact 22. This is referred to as reverse conduction mode.

Figure 4:
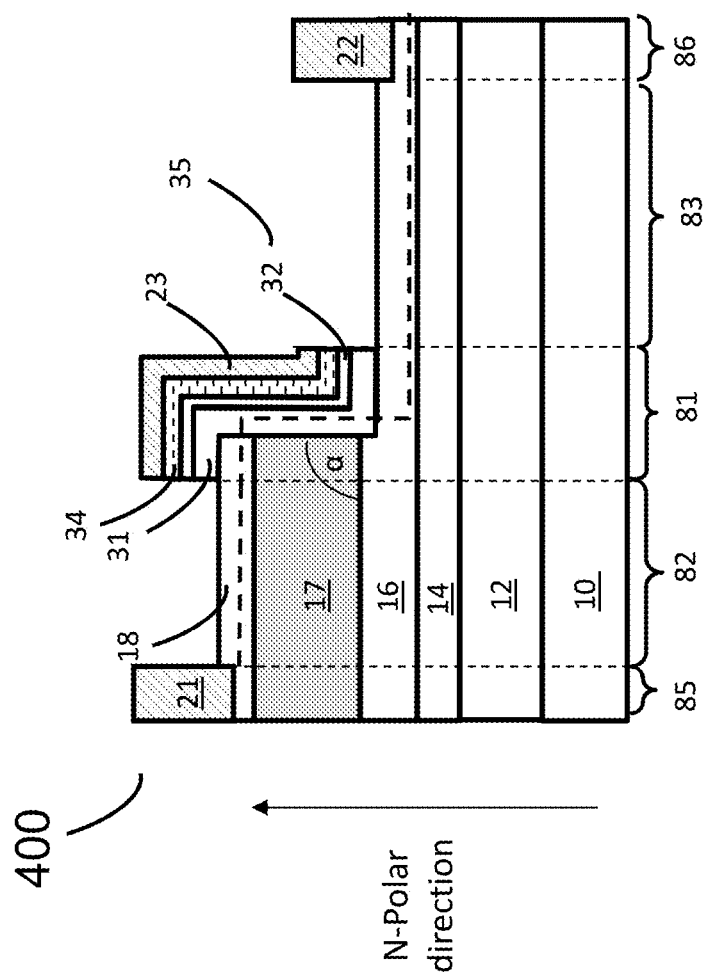
FIG. 4 is a cross-sectional view of a III-N device having an N-Polar orientation and a regrown III-N material layer structure in a gate region.

Referring now to FIG. 4, a cross-sectional view of an N-Polar III-N device 400 is shown. The III-N device 400 of FIG. 4 is similar to the III-N device 200 of FIG. 2, except that device 400 includes an additional III-N layer structure (e.g., a regrown III-N layer structure) between the gate insulator layer 34 and the device III-N material structure at least in the gate region 81 of the device. Hereafter, this additional III-N layer structure is referred to as a mobility enhancement layer.

As seen in FIG. 4, the mobility enhancement layer structure can include multiple layers, for example a GaN mobility enhancement layer 31 and an AlGaN mobility enhancement layer 32 over the GaN mobility enhancement layer 31. The GaN layer 31 and the AlGaN layer 32 can be grown conformally over the vertical sidewall of the III-N body layer 17 in the gate region 81. The mobility enhancement layer can extend continuously over the top surface and be directly contacting of the III-N capping layer 18 extending to the source contact 21, and over the top surface of the III-N channel layer 16 extending to the drain contact 22 (not shown). The mobility enhancement layers can be in direct contact with the III-N napping layer 18 in the source-side access region 82, and in direct contact with the III-N channel layer 16 in the drain-side access region 83. Alternatively, the gate contact 23 can be used as an etch mask to etch the AlGaN layer 32 and the GaN layer 31, such that the regrown III-N layer structure remains directly beneath the gate contact 23 but is etched away, or partially etched away, everywhere else.

The GaN mobility enhancement layer 31 can be unintentionally doped (UID) GaN or the GaN mobility enhancement layer 31 can be doped (e.g., with Si, Fe, C, Mg) to compensate any undesired UID n-type or UID p-type conductivity. The thickness and composition of the GaN layer 31 and AlGaN layer 32 can be selected to optimize mobility and threshold voltage. The GaN layer 31 can have a thickness on the vertical sidewall region of the III-N body layer 17 of between 0.5 nm and 50 nm, preferably between 2 nm and 10 nm. If the GaN layer 31 thickness is too low, electron scattering can negatively affect the channel mobility. If the GaN layer 31 thickness is too high, the threshold voltage may become too low because the ionized acceptors in the III-N body layer 17 are no longer able to fully deplete the vertical channel. The AlGaN layer 32 can have a thickness between 0.2 nm and 20 nm, preferably between 0.5 nm and 3 nm. If the AlGaN layer 32 thickness is too low, similar electron scattering mechanisms as mentioned above, can negatively affect channel mobility. Alternatively, if the AlGaN thickness is too high, a parasitic channel may form at the interface between the AlGaN layer and the gate insulator compromising the device operation. The AlGaN layer can have an aluminum composition between 20% and 100%, preferably between 50% and 100%. An Aluminum composition greater than 50% (relative to the total group-III composition in layer 32) can result in a greater barrier height between GaN layer 31 and AlGaN layer 32, thus improving carrier confinement, preventing carriers from reaching the gate insulator where they can be trapped, causing $V_{TH}$ instabilities.

Although not shown in FIG. 4, either the GaN layer 31 or the AlGaN layer 32 can be omitted from the mobility enhancement layer structure. The device 400 can be advantageous over the device 200 because in device 400, the inversion channel forms at the interface between GaN layer 31 and AlGaN layer 32, thus avoiding electron scattering from the ionized acceptors of III-N body layer 17 and defects from the gate insulator layer 34, increasing the electron mobility. The increased electron mobility can decrease the on-resistance in the gate region, decrease over-all device size and reduce manufacturing costs. In addition, the higher electron mobility in the gate region can achieve the same on-state resistance by using longer gate lengths, therefore preventing short-channel effects (e.g., DIBL) and improving $V_{TH}$ stability.

Alternatively, the thickness and composition of the mobility enhancement layer can be such that the device is a depletion-mode (D-mode) device. To form a D-mode device, the AlGaN layer 32 can be doped with silicon, preferably with a silicon delta doping profile close to the interface between GaN layer 31 and AlGaN layer 32. The silicon doped region in the AlGaN layer 32 is between 1-10 nm away from the interface. The positive charge from ionized donors in the silicon delta doping profile attracts electrons at the interface between the regrown AlGaN/GaN layers, thus forming a channel in the gate region 81 even when no voltage (i.e., 0V) is applied to the gate contact 23 relative to the source contact 21 (D-mode operation). For the embodiment of a D-mode device, the thickness of the AlGaN layer 32 can be preferably between 2 nm and 50 nm.

The device 400 operates as follows: when the gate contact 23 is biased relative to the source contact 21 at a voltage that is greater than the threshold voltage of the device, an inversion layer forms an electron channel in the GaN layer 31 in the gate region 81 of the device, thereby electrically connecting the III-N capping layer 18 to the 2DEG channel 19. When a positive voltage is applied to the drain 22, electrons flow from the source 21, through the conductive III-N capping layer 18, through the electron channel in the GaN layer 31 in the gate region 81, into the 2DEG channel 19, and to the drain 22 forming a continuous device channel between the source contact 21 and the drain contact 22, as shown in FIG. 4.

When the gate contact 23 is biased relative to the source contact 21 at a voltage that is lower than the threshold voltage of the device, the p-type dopants in the III-N body layer 17 fully depletes the GaN layer 31 and AlGaN layer 32 such that there is no channel in the gate region 81 of the device, and therefore the device channel is discontinuous between the source 21 and the drain 22. When a positive voltage is applied to the drain, the voltage blocking mechanism of device 300 in the off-state is the same as the voltage blocking mechanism of device 200, as previously described.

Figure 5:
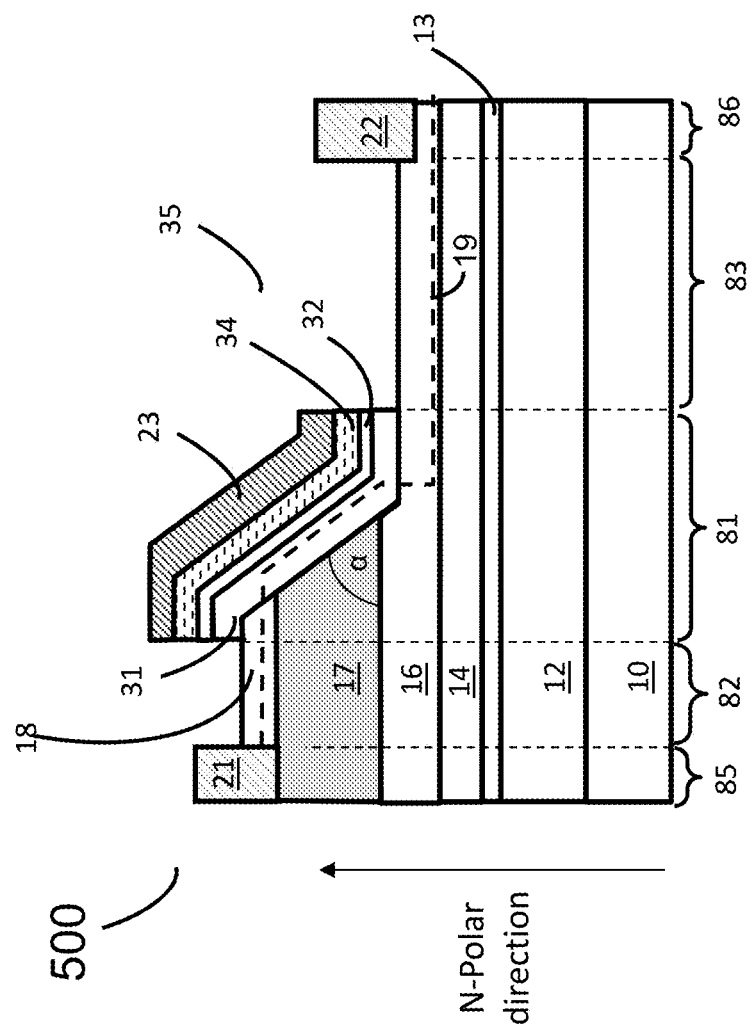
FIG. 5 is a cross-sectional view of a III-N device having an N-polar orientation and a slanted III-N material layer structure in a gate region.

Now, referring to FIG. 5, a cross-sectional view of an N-Polar III-N device 500 is shown. The III-N device 500 of FIG. 5 is similar to the III-N device 400 of FIG. 4, except that device 500 depicts an embodiment where the average sidewall angle α of the III-N body layer 17 in the gate region 81 relative to the top surface of III-N channel layer 16 (opposite the substrate) is <90°, for example between 20°-80°, e.g., 30°-80° or 30°-70°. This angle α can be for example less than 70° relative to the III-N channel layer 16. The device 500 can have several performance advantages over the device 400. Due to the semi-polar crystal orientation of the regrown III-N mobility enhancement layers (layer 31 and 32) on the sidewall in the gate region 81, a net negative polarization charge can arise in the GaN layer 31, therefore increasing the threshold voltage of the device. The angle α, the thickness and the composition of the GaN layer 31 and the AlGaN layer 32 are selected to optimize the net polarization charge at the interface between the GaN layer 31 and AlGaN layer 32. As the angle α decreases, the closer the sidewall of the GaN layer 31 is to the N-polar plane, which increases the net negative polarization charge, and in turn increases the VIE of the device. In addition, the higher the Aluminum composition of the AlGaN layer 32, the higher is the net negative polarization charge, which also increases the VIE. This allows the device 500 to have an increased threshold voltage compared to device 400 while still maintaining a high channel mobility, low on-resistance, and high breakdown voltage.

FIG. 5 also depicts an n-type GaN:Si layer 13 disposed between the III-N buffer layer 12 and the III-N back-barrier layer 14. The GaN:Si layer 13 acts to prevent the formation of a parasitic two-dimensional hole-gas near the bottom of the back-barrier layer 14. If holes accumulate near the bottom of the back-barrier, the device may suffer from parasitic leakage current and VIE instabilities due to hole-trapping. If the doping of the GaN:Si layer is too low, parasitic hole accumulation can occur, however if the doping is too high, parasitic electron accumulation can occur near the bottom of the back-barrier layer 14. The GaN:Si layer 13 can have a thickness between 1 nm and 50 nm, for example the GaN:Si layer 13 can have a thickness greater than 1 nm and less than 20 nm. Although not shown in FIGS. 2-4, the GaN:Si layer 13 can also be included as the first or second portion of the III-N back barrier layer 14, as described in device 200-400. The gate, drain, and source contact configurations can be similar to those described in device 100.

Figure 6:
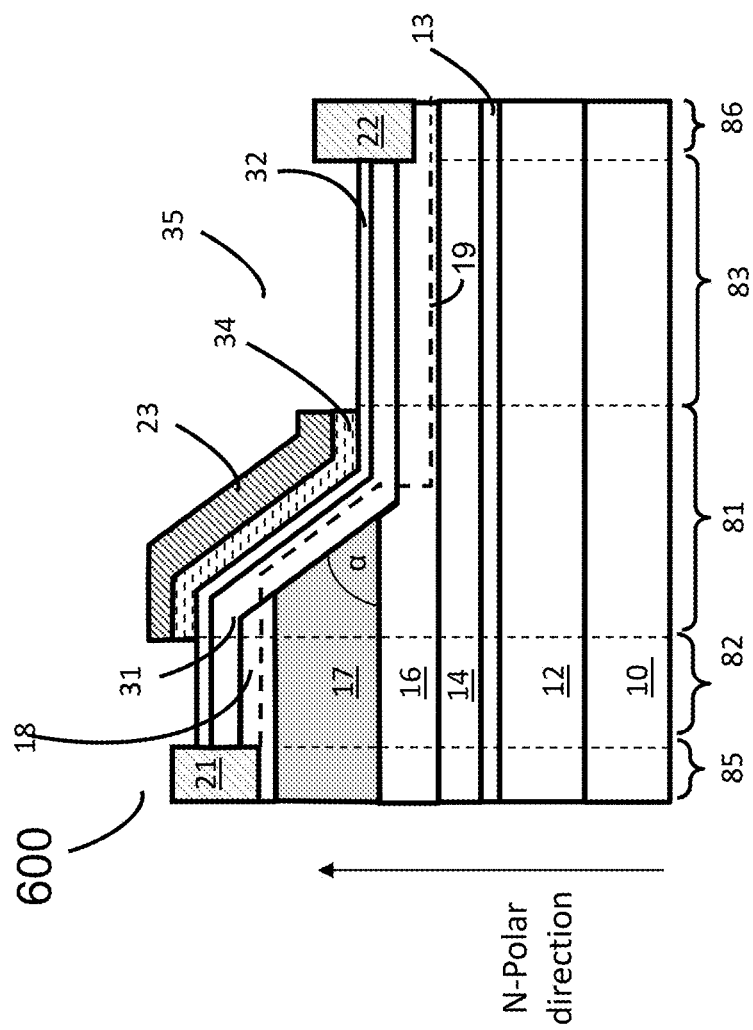
FIG. 6 is alternative embodiment of the III-N device of FIG. 5.

Now, referring to FIG. 6, a cross-sectional view of an N-Polar III-N device 600 is shown. The III-N device 600 of FIG. 6 is similar to the III-N device 500 of FIG. 5 except that device 600 depicts an embodiment where the additional (e.g., regrown) III-N mobility enhancement layer structure (including the AlGaN layer 32 and the GaN layer 31) extends continuously between the source contact 21 and the drain contact 22. The regrown GaN layer 31 and AlGaN layer 32 in the source side and drain side access regions can improve the device 600 over device 500 for the following reasons: (i) the regrown III-N layer 31 and 32 will reconstruct and passivate the etched top surface of the III-N channel layer 16 in the drain side access region, (ii) due to the net negative polarization charge at the interface of the AlGaN layer 32 and the GaN layer 31 in N-polar structures, the electric-field can decrease in the off-state, resulting in a lower off-state leakage and higher breakdown voltage, and (iii) the regrown AlGaN layer 32 can act as a selective etch-stop layer, which is required for the realization of high-voltage field-plating structures in the drain side access region. Alternatively, the mobility enhancement layers of the embodiment of FIG. 6 can omit the AlGaN layer 32, and be solely comprised of the GaN layer 31.

A method of forming the device 600 of FIG. 6 is as follows. An N-polar III-N material structure is formed. Forming the N-polar III-N material structure includes forming a III-N buffer layer 12 on a suitable substrate 10, for example on a miscut sapphire substrate. The III-N buffer layer 12 can consist of forming a thin N-polar GaN nucleation layer on the substrate and a carbon-doped GaN buffer layer on the nucleation layer. Next, a III-N back-barrier layer is formed over the buffer layer where a first portion 13 is a silicon doped graded AlGaN layer and a second portion 14 is an unintentionally doped constant composition AlGaN layer. A III-N channel layer 16 is formed over the III-N back barrier layer 14, and a 2 dimensional electron gas (i.e., 2DEG layer) 19 is formed at the interface between layer 14 and layer 16. Next, a p-type III-N body layer 17 is formed over the III-N channel layer 16 and an n-type III-N capping layer 18 is formed over of the III-N body layer 17. The interface of the between the III-N body layer 17 and the III-N capping layer 18 can be formed through a tunnel junction. Forming the tunnel junction can comprise forming a $p^{++}/AlN/n^{++}$ material layer structure, for example, a 20 nm thick p++ layer (e.g., doped with magnesium with a concentration of $2 \times 10^{19}$ cm$^{-3}$) at the top surface of the III-N body layer 17, forming a thin AlN or AlGaN inter-layer (for example 1.5 nm thick) over the p++ layer, and forming a n++ layer, for example, a 20 nm thick n++ layer (e.g., doped with silicon with a concentration of $2 \times 10^{19}$ cm$^{-3}$) at the bottom surface of the III-N capping layer 18. Next, forming the device 600 comprises removing the III-N capping layer 18, the III-N body layer 17 and a portion of the III-N channel layer 16 in the drain-side access region 83 of the device, for example by dry-etching, exposing a surface of the III-N material structure, forming a trench recess 35. An exposed sidewall of the removed III-N material layers is formed in the gate region 81, where the angle of the exposed sidewall relative to the top surface of the III-N channel layer 16 is between 30 and 70 degrees. Next, a regrown III-N mobility enhancement layer is formed over the exposed surface of the III-N material structure and a gate dielectric 34 is formed over the mobility enhancement layer. Next, the mobility enhancement layer and the gate dielectric are removed in the source and drain regions 85 and 86 respectively and optionally at least a portion of the III-N capping layer 18 in the source region 85. Next, forming the device comprises anneal the device at high temperature to electrically activate the p-type III-N body layer 17. Next, source and drain ohmic contacts are formed by depositing metal stack containing aluminum (Al), Ti/Al or the like, in the source and drain regions. Finally, a gate metal stack 33 (e.g., Ti/Al) is formed in the gate region 81 of the device.

Figure 7:
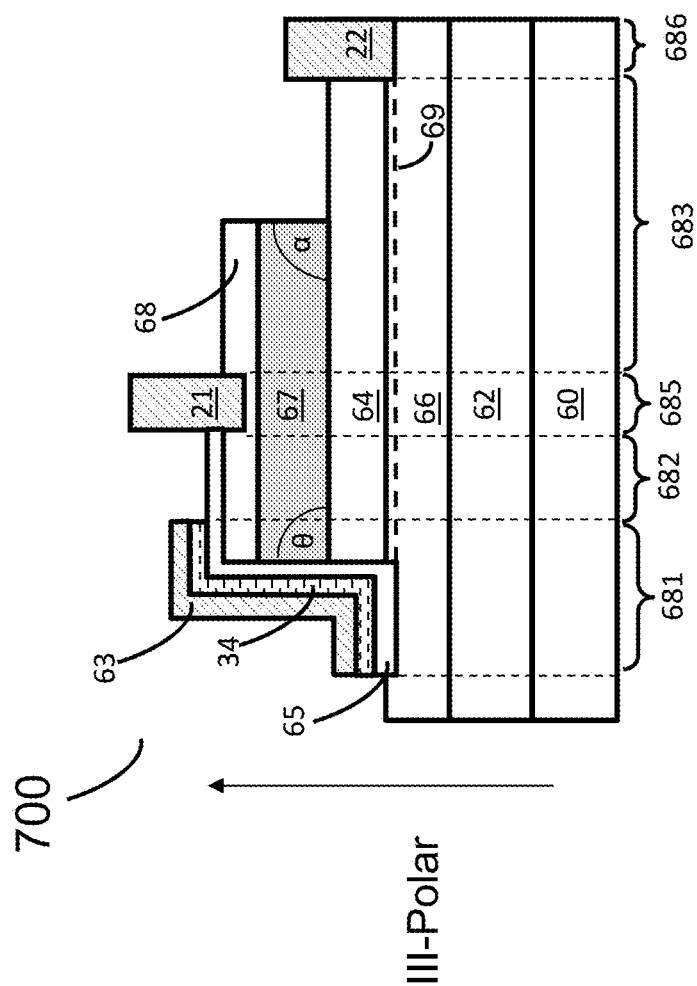
FIG. 7 is a cross-sectional view of a III-N device having a group-III polar orientation and a Gate-Source-Drain (G-S-D) configuration.

Referring now to FIG. 7, a group-III Polar III-N enhancement mode (E-mode) device 700 is shown. The III-N device

700 includes a III-N buffer layer 62, for example GaN or AlGaN, grown on a suitable substrate 60, which can for example be silicon, silicon carbide, sapphire, AlN, or GaN. The III-N buffer layer 62 and substrate 60 can have similar properties to or be the same as layer 10 and 12 of device 200. The III-N device 700 further includes a III-N channel layer 66, for example unintentionally doped (UID) GaN, over the III-N buffer layer 62, and a III-N barrier layer 64, for example $Al_xGa_{1-x}N$, over the III-N channel layer 66. The bandgap of the III-N barrier layer 64 is typically greater than that of the III-N channel layer 66. The III-N channel layer 66 has a different composition than the III-N barrier layer 64, and the thickness and composition of III-N barrier layer 64 is selected such that a two-dimensional electron gas (2DEG) channel 69 (indicated by the dashed line in FIG. 6) is induced in the III-N channel layer 66 adjacent the interface between layers 64 and 66.

A III-N body layer 67 is formed over at least a portion of the III-N barrier layer 64. The III-N body layer 67 is formed at least between a gate contact 63 and a source contact 21 and removed (typically by dry or wet etching) in at least a portion of the device access region 683 between the source contact 21 and the drain contact 22, as shown in FIG. 7. A vertical or substantially vertical side wall is formed along the drain side edge of the III-N body layer 67 at an average angle $\alpha$ relative to a top surface of the III-N barrier layer 64, where the top surface is opposite the substrate 60. As seen if FIG. 7, the angle $\alpha$ is approximately 90° (e.g., between 80°-90°). However, the sidewall of the III-N body layer 67 can be slanted at an angle $\alpha<90°$, for example between 20°-80° relative to the top surface of the III-N barrier layer 64 opposite the substrate 60. The III-N body layer 67 can be either a p-doped layer or a semi-insulating/insulating layer (i-GaN) with similar properties as layer 17 of FIG. 2. An n-type doped III-N capping layer 68 is formed over the III-N body layer 67 and can have similar properties to or be the same as the III-N capping layer 18 of FIG. 2. The source 21 can contact the n-type III-N capping layer 68 and/or can be recessed into the III-N capping layer such that the source 21 is in contact with the III-N body layer 67 (not shown). The methods of connecting the source to the III-N body layer, as well as the structural configuration, can be the same as that described for device 200.

A portion of the III-N material structure layers 64, 67, and 68 are removed on a side of the source contact 21 opposite the drain contact 22 such that a top surface of the III-N channel layer 66 is exposed in a gate region 681. A vertical sidewall of the III-N layers 64, 67, and 68 is formed in the gate region 681 at an angle $\theta$ relative to a top surface of the III-N barrier layer 64, where the top surface is opposite the substrate 60. As seen if FIG. 7, the angle $\theta$ can be approximately 90° (e.g., between 80°-90°). However, the sidewall of the III-N layers can be slanted at an angle $\theta<90°$, for example between 20°-80°. The sidewall of the III-N material structure in the gate region of the device can be substantially vertical (90°, i.e., non-polar plane), or the sidewall can be slanted at an angle $\theta<90°$ (i.e., semi-polar plane). Preferably, the angle $\theta$ can be close to 90° (vertical) to ensure the gate channel is formed on the non-polar plane. If the angle $\theta$ is lower than 90°, for example less than 70°, and the gate stack comprises a regrown III-N material structure which includes an AlGaN/GaN layer, the semi-polar plane on III-N polar structure can induce a net positive polarization charge at the AlGaN/GaN interface, causing an undesirable decrease in device threshold voltage. The angle $\theta$ can be substantially the same as the angle $\alpha$, or the two angles can be substantially different. One angle may be vertical, while the other angle is slanted, for example, the angle $\alpha$ can be approximately 90° and the angle $\theta$ can be between 45°-90° (or vice versa). Although not shown, each of the material layers 64, 67, and 68 may have different angles due to the different compositional and etching properties of each layer. For the sake of clarity, the angles $\theta$ and $\alpha$ specifically refer to the angle of the III-N body layer 67 relative to the top surface of III-N barrier layer 64 (opposite the substrate).

A gate contact 63 and a gate insulator layer 34 are formed over the exposed vertical sidewall of the III-N material structure, as shown in FIG. 7. The device 700 of FIG. 7 has a Gate-Source-Drain (G-S-D) configuration, that is to say the source contact 21 is between the gate contact 63 and the drain contact 22. In addition, any source connected field plate structures (not shown) that could be disposed on the device are also located between gate contact 63 and the drain contact 22 such that all portions of the source electrode are disposed between the gate and the drain (i.e., the source is entirely contained between the gate contact 63 and the drain contact 22).

Furthermore, a regrown III-N gate mobility enhancement layer 65 can be disposed between the gate insulator layer 34 and the sidewall portion of the exposed III-N material structure in the gate region 681, as shown in FIG. 7. The III-N gate enhancement layer 65 can be, for example a combination of multiple III-N layers (e.g., GaN and AlGaN) with similar properties as the mobility enhancement layers 31 and 32 respectively of FIG. 4; however, for the device of FIG. 7, the gate mobility enhancement layer 65 is grown in a III-polar orientation if the angle $\theta$ is less than 90°. Alternatively, the regrown III-N gate mobility enhancement layer 65 can be formed with properties such that the device 700 is a depletion mode device. Furthermore, a depletion-mode (D-mode) device can be fabricated when the III-N gate mobility enhancement layer 65 is doped with Si, similar to the depletion mode regrown III-N layer structure described in device 400 or by decreasing the angle $\theta$ (e.g., less than 70°), forming a semi-polar plane in layer 65 such that the magnitude of the induced net positive polarization charge in layer 65 causes the threshold voltage to be less than 0V. A continuous 2DEG channel layer 69 exists in a region of the III-N channel layer 66 near the interface of the III-N barrier layer 64 which has not been removed in the gate region of the device.

Figure 8:
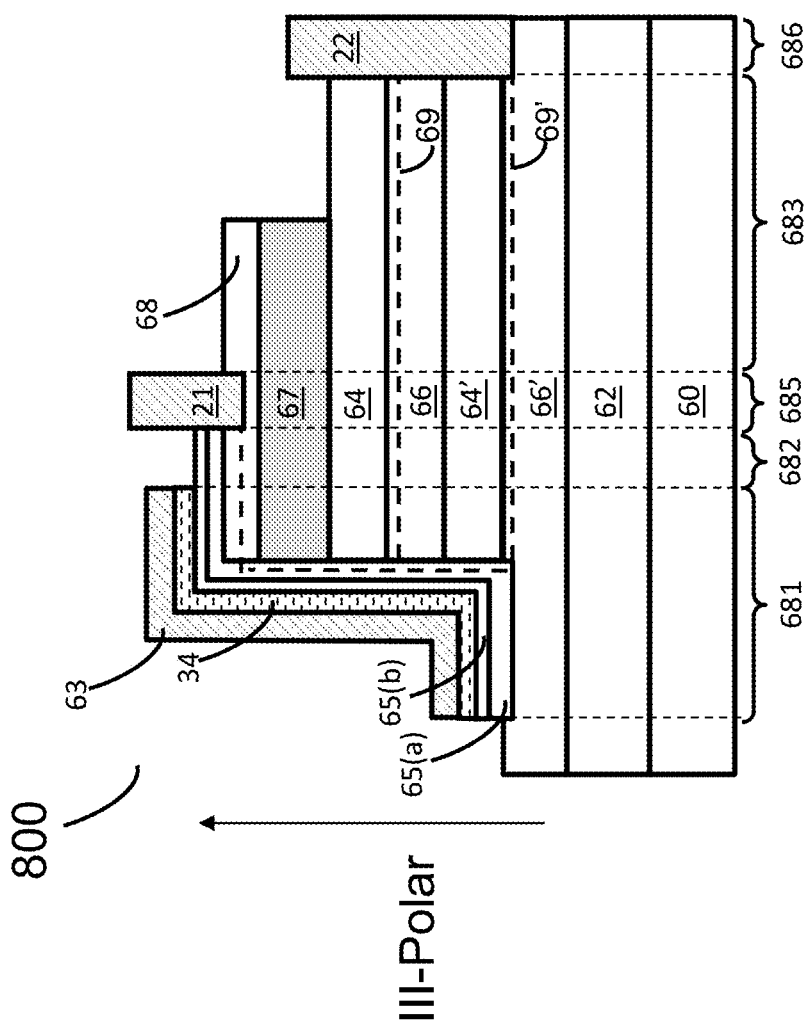
FIG. 8 is a cross-sectional view of a III-N device having a group III polar orientation and multiple III-N channel layers.

Now, referring to FIG. 8, a cross-sectional view of a group-III Polar III-N device 800 is shown. The III-N device 800 of FIG. 8 is similar to the III-N device 700 of FIG. 7, except that device 800 depicts an embodiment with a primary 2DEG channel 69 and a secondary 2DEG channel 69'. A second III-N barrier layer 64' and a second III-N channel layer 66' are formed below the III-N channel layer 66. The second III-N barrier layer 64' and second III-N channel layer 66' can have similar composition and thickness as layers 64 and 66 respectively or they can be different. For example, the composition and thickness of the second III-barrier layer 64' and second III-N channel layer 66' can be selected such that charge induced in the secondary 2DEG channel 69' is less than the charge induced in the primary 2DEG channel 69. Furthermore, the device 800 of FIG. 8 can be configured to have 3 or more 2DEG channels, such that alternating AlGaN/GaN (barrier/channel) layers $\eta$-times in the device will induce $\eta$-number of 2DEG channels. Here, $\eta$ can be greater than 5. For example, each 2DEG channel can be configured such that the induced charge is reduced with each subsequent layer, with the lowest charge being in the channel proximal to the substrate 10 and the highest charge being in the channel distal to the substrate 10.

Forming multiple channels in the device 700 allows the 2DEG charge to be optimize for mobility by adding additional channels as needed. Furthermore, by tailoring the 2DEG charge density for each channel, the 2DEG charge of each channel can be tuned to optimize field-plating. The deeper the channel is in the III-N material structure, the more difficult the channel is to field-plate, for this reason it can be preferable to decrease the 2DEG charge from the channel distal the substrate to the channel proximal the substrate. In addition, FIG. 8 shows the components of the regrown III-N gate mobility enhancement layer 65 disposed as multiple layers with a first, regrown III-N channel layer 65(a) and a second, regrown III-N barrier layer 65(b), which can also be present in device 700.

The devices 700 and 800 of FIGS. 7 and 8 work as follows: the threshold voltage of the device (i.e., the voltage required to turn on the channel in the gate region) is determined by the material stack between the III-N body layer 67, the III-N regrown layers 65(a) and 65(b), the gate insulator layer 34 and the gate contact 63. When the gate contact 63 is biased relative to the source contact 21 at a voltage that is greater than the threshold voltage of the device, an electron channel forms in the regrown III-N gate mobility enhancement layer 65 in the gate region of the device 681. The electron channel formed in the gate region 681 connects to the η-number of 2DEG channels. When a positive voltage is applied to the drain 22, electrons flow from the source 21, through the conductive n-type III-N capping layer 68, through the electron channel in the gate region, into the η-number of 2DEG channels, and to the drain 22 forming a continuous device channel between the source contact 21 and the drain contact 22.

When the gate contact 63 is biased relative to the source contact 21 at a voltage that is lower than the first threshold voltage of the device, the p-type dopants in the III-N body layer 67 fully depletes the interface of the III-N layer 65(a) and the III-N layer 65(b) such that there is no mobile charge and no electron channel in the gate region 681 between the gate 63 and the III-N body layer 67, and therefore the device channel is not continuous between the source 21 and the drain 22. When a positive voltage is applied to the drain, the current blocking mechanism is similar to that previously described for device 200.

Figure 9:
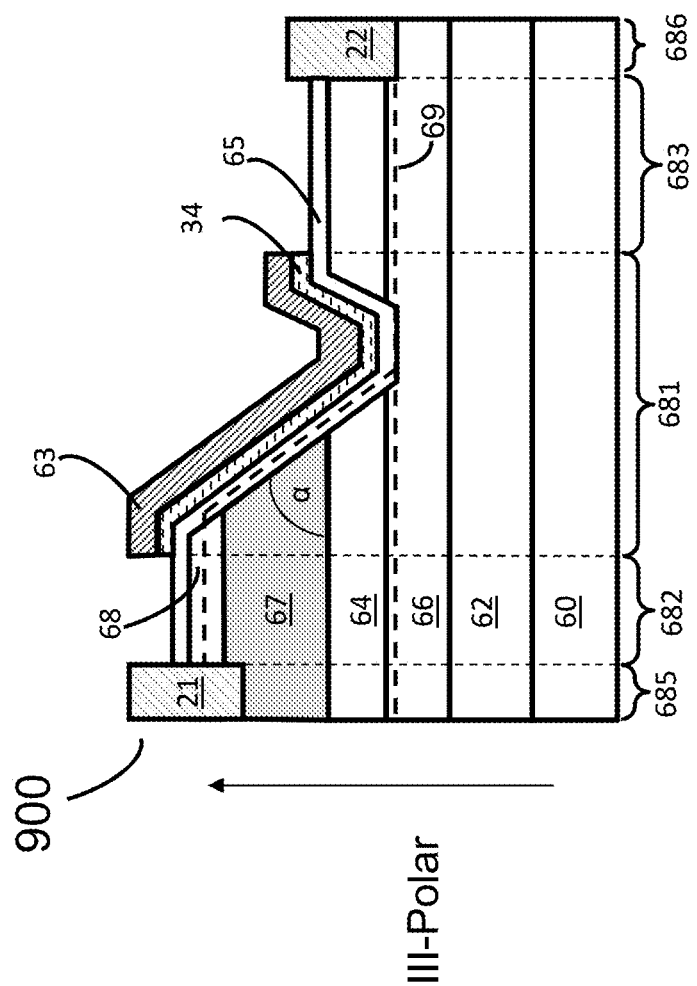
FIG. 9 is a cross-sectional view of a III-N device having a group-III polar orientation and a vertical gate channel.

Now, referring to FIG. 9, a cross-sectional view of a group-III polar III-N device 900 is shown. The III-N device 900 of FIG. 9 is similar to the III-N device 700 of FIG. 7, except that device 900 depicts an embodiment with a Source-Gate-Drain (S-G-D) configuration, that is to say the gate contact 63 is between the source contact 21 and the drain contact 22. In order to fabricate the device 800, a recess is formed through the III-N barrier layer 64 to expose a top surface of the III-N channel layer 66, and the recess can partially extend into the channel layer 66. The region of the III-N channel layer 66 below the recess can optionally be doped n-type (e.g., doped with silicon) to increase the mobility of the device channel in the recessed region. The recess in the III-N barrier layer 64 is between the vertical sidewall edge of the III-N body layer 67 and the drain contact 22 in the gate region 681 of the device. A regrown III-N gate mobility enhancement layer 65, a gate insulator layer 34, and a gate contact 63 are formed conformally over the vertical sidewall of the III-N body layer 67 and in the recess formed in the III-N barrier layer 64, as shown in FIG. 7. The III-N gate enhancement layer 65 can be, for example a combination of multiple III-N layers (e.g., GaN and AlGaN) with similar properties as the mobility enhancement layers 65(a) and 65(b) respectively of FIG. 8. The mobility enhancement layer 65 can extend continuously over the top surface of the III-N capping layer 68 extending to the source contact 21, and over the top surface of the III-N barrier layer 64 extending to the drain contact 22, or the gate contact 23 can be used as an etch mask to etch the mobility enhancement layer 65, such that the regrown mobility enhancement layer remains directly beneath the gate contact 23 but is etched away, or partially etched away, everywhere else (not shown). The device 900 of FIG. 9 can have a reduced drain side access region length (i.e., lower on-resistance) and lower peak electric fields between the source and the drain contacts compared to the device 700 of FIG. 7, however additional processing steps and photomask layers may be required to form the recess in the III-N barrier layer 64.

Figure 10:
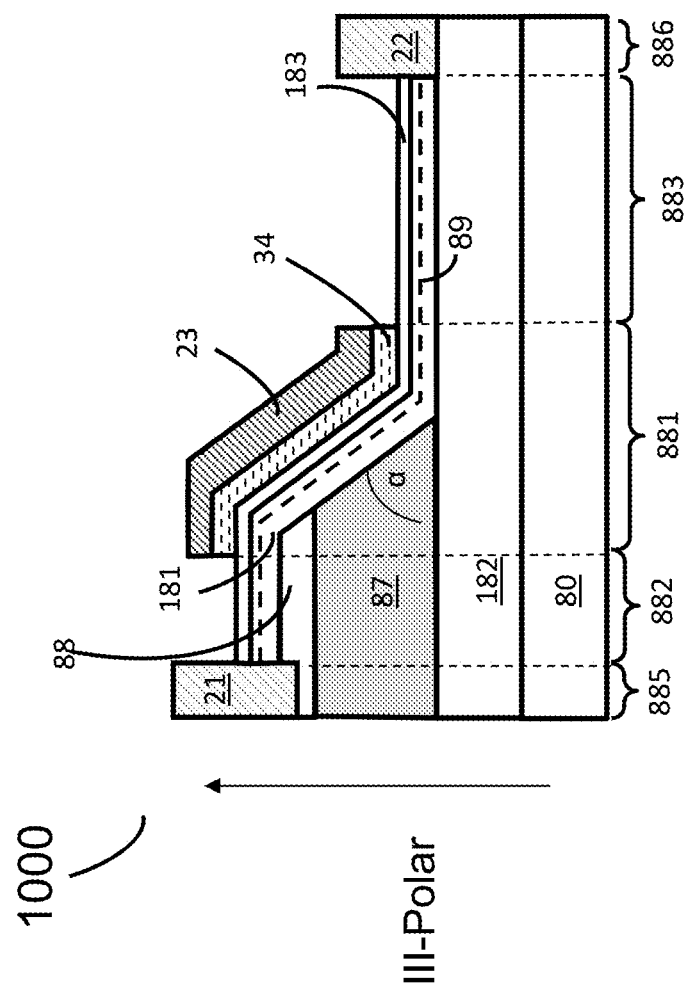
FIG. 10 is a cross-sectional view of a depletion mode III-N device having a group-III polar orientation and a regrown III-N channel layer.

Referring now to FIG. 10, a group-III polar III-N depletion mode device 1000 is shown. The III-N device 1000 includes a III-N buffer layer 182, for example GaN, AlGaN, or unintentionally doped (UID) GaN, grown on a suitable substrate 80, which can for example be silicon, silicon carbide, sapphire, AlN, or GaN. The III-N buffer layer 182 and substrate 80 can have similar properties to or be the same as layers 12 and 10, respectively, of device 100. A III-N body layer 87 is can be between the gate contact 23 and the source contact 21 but not between the gate contact 23 and the drain contact 22. For example, the III-N body layer 87 can be formed over the entire III-N buffer layer and then removed (e.g., by dry and/or wet etching) everywhere except between where the gate contact 23 and the source contact 21 are subsequently deposited, as shown in FIG. 10. The III-N body layer 87 can be a p-doped layer with similar properties to layer 17 of FIG. 2. An n+ doped III-N capping layer 88 is formed over the III-N body layer 87 and can have similar properties to the III-N capping layer 18 of FIG. 2. The source 21 can contact the n+ III-N capping layer 88 or be recessed into the III-N capping layer such that the source 21 is in contact with the III-N body layer 87, as previously shown. A portion of the III-N material structure layers 87, 88, are removed in the drain side access region 883 and at least partially removed in the gate region 881, as shown in FIG. 10, such that a top surface of the III-N buffer layer 82 is exposed.

A III-N channel layer 181 (e.g., a regrown GaN layer) and a III-N barrier layer 183 (e.g., a regrown AlGaN layer) over the channel layer 181, can be formed (e.g., deposited) over the exposed top surface of the III-N material structure. The channel layer 181 and the barrier layer 182 extend continuously between the source contact 21 and the drain contact 22, which are subsequently formed. The regrown III-N layers 181 and 183 can be disposed over a top surface of the n+ III-N capping layer 88, conformally over the vertical sidewall portion of the III-N body layer 87 in the gate region 881, and over the top surface of the III-N buffer layer 182 in the drain side access region 883, as shown in FIG. 10. The bandgap of the regrown III-N barrier layer 183 is typically greater than that of the regrown III-N channel layer 181. The channel layer 181 has a different composition than the barrier layer 183, and the thickness and composition of barrier layer 183 is selected such that a two-dimensional electron gas (2DEG) channel 89 (indicated by the dashed line in FIG. 10) is induced in the regrown III-N channel layer 181 adjacent the interface between layers 181 and 183. The thickness of the channel layer 181 can be between 10 nm and 300 nm, for example 50 nm. The thickness of the barrier layer 183 can be between 1 nm and 100 nm, for example 30 nm. The thickness of the channel layer 181 can be sufficiently thick such that the p-doped III-N body layer 87 does not fully deplete the 2DEG channel in the gate region 881 of the device, when the gate electrode is biased above the threshold voltage of the device.

A gate insulator layer 34 and gate contact 23 can be deposited in a gate region 881 of the device conformally over the top surface of the regrown III-N barrier layer 83. The gate insulator layer 34 and the gate contact 23 can have similar properties to or be the same as described in device 200 of FIG. 2. Source contact 21 and drain contact 22 are formed in a source region 885 and drain region 886 respectfully. The source contact 21 and drain contact 22 can be configured similar to the source and drain contacts of device 200 of FIG. 2. The drain 22 contacts the regrown III-N channel layer 181. A recess can be formed in the III-N channel layer 181 to allow for improved contact of the drain electrode to the 2DEG channel 89.

The depletion mode III-N device 1000 of FIG. 10 operates as follows: when the gate electrode 23 is biased relative to the source 21 at a voltage that is greater than the threshold voltage of the device, the 2DEG channel 89 extends continuously through the regrown III-N channel layer 181 between the source contact 21 and the drain contact, and the device is considered to be in the ON state. When the gate 23 is biased relative to the source 21 at a voltage that is lower than the threshold voltage of the device, the 2DEG channel 19 is depleted of charge in the gate region 881 of the device, and therefore the device channel is discontinuous between the source 21 and the drain 22 and the device is considered to be in the OFF state.

Traditional III-N devices with a lateral gate region typically exhibit a shift in threshold voltage (Vth) after being stressed under continuous use, as previously described. However, in the device 1000 of FIG. 10, the III-N body layer 87 can reduce the $V_{TH}$ shift of the device closer to 0V, when compared to a lateral III-N device without the III-N body layer 87. The benefit of the III-N body layer has been previously described in device 200.

FIG. 11A shows an example embodiment cross-sectional view of a low voltage E-mode FET integrated monolithically with a high voltage D-mode FET to create an integrated III-N device 1100 capable of operating at high voltages, such as greater than 600V or greater than 1200V. The device 1100 of FIG. 11A is constructed using the low voltage enhancement mode gate-module of device similar to device 600 of FIG. 6, in combination with field-plating structures 36 in a traditional depletion mode module designed to control the high voltage portion of the device. The enhancement mode gate-module of the device is shown as region 901, and the depletion mode high voltage module with field-plating structures 36 is shown as region 902.

Figure 11B:
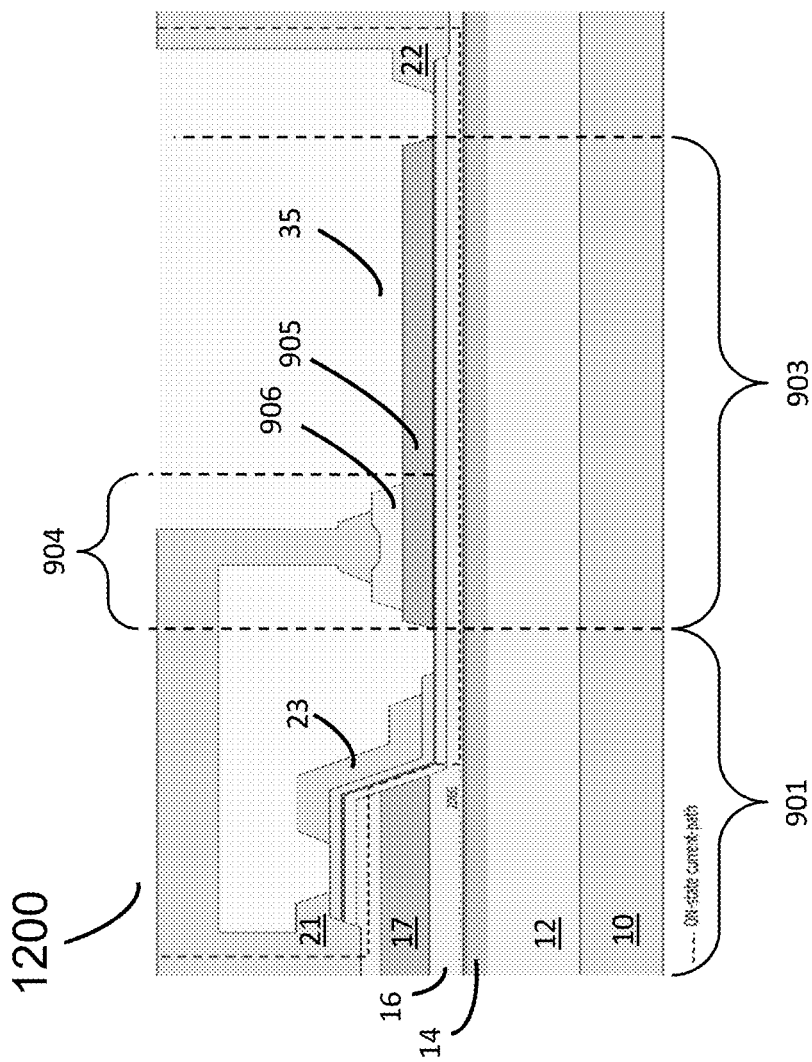

FIG. 11B shows an example embodiment cross-sectional view of a low voltage E-mode FET integrated monolithically with a high voltage D-mode FET to create an integrated III-N device 1200 capable of operating at high voltages, such as greater than 600V or greater than 1200V, greater than 3300V, or greater than 10 kV. The device 1200 of FIG. 11B is constructed using the low voltage enhancement mode gate-module 901 which is similar to device 600 of FIG. 6, in combination with a charge-balancing module designed to control the high voltage portion of the device. The enhancement mode gate-module of the device is shown as region 901, and the depletion mode high voltage module with charge balancing structures is shown as region 903.

The charge-balancing region 903 can be defined by a III-N charge-balancing layer 905 positioned in the drain-side access-region of device 1200. The III-N charge balancing layer 905 material structure can be formed (e.g., regrown) after the trench recess 35 in the drain-side access region is formed. The III-N charge-balancing layer 905 can be connected to the source electrode through a charge-balancing contact region 904 and electrically isolated from the drain electrode. The charge-balancing contact region 904 can be formed on a side of the charge-balancing region 903 closest to the gate-module, therefore protecting the contact region 904 from high voltage near the drain electrode. For example, the area of the III-N charge balancing layer 905 between the charge-balancing contact region 904 and the drain contact 22 is greater than the area of III-N charge balancing layer 905 between the charge-balancing contact region 904 and the source contact 21.

The III-N charge-balancing layer 905 can be realized by a single III-N layer or by multiple III-N layers with varying Al, In, or GaN composition. The charge-balancing layer stack can be p-type III-N layer. The composition of the p-type doping can be provided by impurity incorporation (e.g., magnesium) or by polarization doping (e.g., positive polarization field gradient in the [000-1] direction). The p-type doping density concentration across the III-N charge-balancing layer 905 can have a uniform profile, a multiple graded profiles, a multiple box-function-like profile, or a multiple delta-function-like profile. The charge balancing layer 905 can be a high-k dielectric material layer.

The charge-balancing layer can be designed such that, in the off-state, the density of the net-negative polarization-charge in layer 905 is sufficiently similar (e.g., within 50%) of the density of the net-positive polarization-charge in the III-N channel layer 16. The charge-balancing layer 905 can be designed such that the 2DEG 19 in the GaN channel 16 and any positive carriers (i.e., holes) in the charge-balancing layer stack can deplete simultaneously across the entire charge-balancing region 903 when a small off-state drain-bias voltage is applied (e.g., less than 30V). The thickness and composition of the charge-balancing module can be selected such that when in the off-state, the charge-balancing is able to block high voltages while maintaining a uniform lateral and vertical electric field in the drain side access region. The distance between the charge-balancing region 903 and the drain contact 23 can be large enough to prevent the depletion region from fully extending to the drain contact 23, for example, greater than 2 um.

High hole-mobility in the charge balancing layer 905 can be achieved with p-type modulation doping III-N hetero-structures, for example, the charge-balancing layer 905 can be formed of an $Al_xGa_{1-x}N$ layer (where x can be greater than 0.5). In another example, the charge-balancing layer 905 can be realized with a thin GaN layer deposited on top of a thin $Al_xGa_{1-x}N$ layer (where x can be greater than 0.5). In another example, the charge-balancing layer 905 can be realized with a periodic repetition of thin GaN layers deposited on top of thin $Al_xGa_{1-x}N$ layers (where x can be greater than 0.5). The p-type doping distribution in the III-N heterostructure can have a uniform profile, or it can have a single or multiple box-function-like profile or it can have a single or multiple delta-function-like profile. The length of the charge balancing layer 905 can be greater than 10 um, can be greater than 25 um or can be greater than 45 um.

The contact between the source electrode and the charge-balancing layer 905 can be formed through a conventional metal-semiconductor ohmic contact or through a tunnel junction contact (similar to the tunnel junction in device 200 of FIG. 2), shown in the charge balancing contact region 904 of FIG. 11B. For an embodiment where the charge-balancing contact is formed with a tunnel-junction, an n-type III-N layer 906 can be formed between the charge-balancing layer 905 and the source electrode metallization. Additionally, the n-type layer 906 can be removed outside the charge balancing contact region 904.

The charge balancing layer 905 can also be formed in a depletion mode III-N device. When used in a depletion mode III-N device, the charge balancing layer 905 can be electrically connected to the gate contact 23 of the depletion mode device instead of electrically connected to the source electrode of an enhancement mode device.

Layouts for implementing the devices of FIGS. 2-6 and 9-10 are illustrated in top-view in FIGS. 12, 13A, 13B, 13C, 13D, 13E, 14A, 14B, 14C, and 14D. FIG. 12 shows a top-view section of a first device layout, hereafter referred to as "plain-layout." A vertical device section 101 and a lateral device section 102 are defined by the vertical sidewall 201 of the III-N body layer 17 in the gate region 81, as shown in FIG. 2. The width of this region (along the width of the gate 23) as seen from the top-view of FIG. 12 is a straight region and corresponds to the gate-width ($W_G$) of the device. In the "plain-layout," the plane-vector of the vertical sidewall is parallel to the direction of the current-flow in the lateral device section 102. The cross-sectional view of devices 200-600 and 900-1000 shown in FIGS. 2-6 and 9-10 can be indicated by the dashed line 6' as shown in FIG. 12.

Figures 13A, 13B:
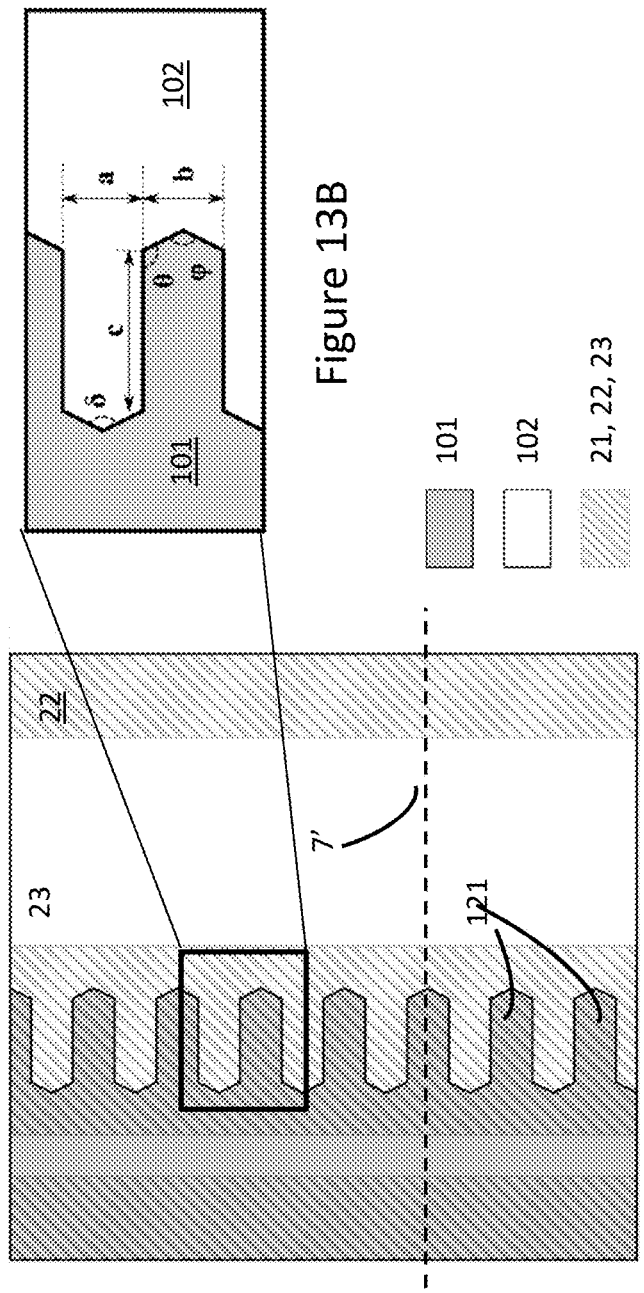

FIGS. 13A and 13B show the top-view section of a second device layout, hereafter referred as "comb-layout", where the boundary between the vertical device section 101 and the lateral device section 102 is defined by a sequence of segments or curves forming an array of features hereafter referred to as "teeth," labeled as 121. The teeth 121 can be designed such that the spacing between adjacent teeth (dimension "a" in FIG. 13B) can be between 20 nm and 20 µm; the width of each tooth (dimension "b" in FIG. 13B) can be between 20 nm and 20 µm; the length of each tooth (dimension "c" in FIG. 13B) can be between 0 µm and 20 µm; the angle at the base of the tooth (angle "δ" In FIG. 13B) can be between 10 and 350 degrees; the angle at the side of the tooth (angle "θ" in FIG. 13B) can be between 10 and 170 degrees; the angle at the top of the tooth (angle "φ" in FIG. 13B) can be between 10 and 350 degrees. Preferably, the angle δ can be between 100 and 200 degrees. Preferably, the angle φ can be between 100 and 200 degrees.

Alternatively, the corners of the teeth can be rounded as seen in FIG. 13C and FIG. 13D. The rounding of the corners can be a result of the photolithography step used to define the teeth or as a result of the etching process used to remove the III-N material structure in the lateral device section 102. The end of the tooth can have a radius r1 while the inside corner of the tooth can have a radius r2 as shown in FIG. 13D. The sequence of segments represents the vertical sidewall edge of the III-N body layer 17 in the gate region 81 as seen from the top-view and corresponds to the gate-width ($W_G$) of device 100-500 and 800-900. The gate contact 23 is deposited over the gate region 81 such that it covers the vertical sidewall along the entire gate-width.

An advantage of the "comb-layout" compared to the "plain-layout" is an increase of the gate-width for the same chip-area. For example, the gate-width of the comb layout can be increased 2×, can be increased 5×, or more, relative to the plain layout. This can reduce the gate channel resistance, and the overall on-state resistance of the device. Another advantage of the "comb-layout" is the ability to arbitrarily orient the plane-vector of the vertical gate-sidewall without changing the direction of the current flow in the lateral device section 102. This design parameter is beneficial when the crystallographic plane required to achieve the best electrical properties of vertical gate-sidewall and the crystallographic plane required to achieve the best electrical properties of the lateral device section 102 are distinct or different. The cross-sectional view of devices 200-600 and 900-1000 shown in FIGS. 2-6 and 9-10 can be indicated by the dashed line 7' as shown in FIG. 13A.

Figure 13E:
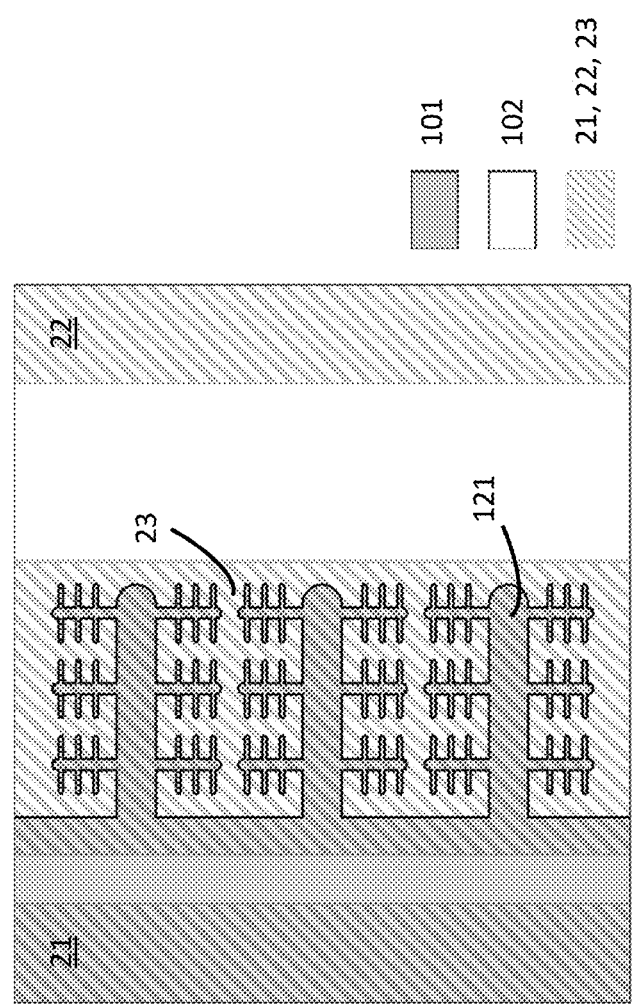

FIG. 13E shows the top-view section of an alternative device layout, hereafter referred as "fractal-layout." The end of the tooth can have a radius r1 while the inside corner of the tooth can have a radius r2 as shown in FIG. 13D. The perimeter of the tooth can be a "fractal," i.e., being self-similar at increasingly small scales, as seen in FIG. 13E. The self-similar scaling of the teeth can be repeated up to a reasonable fabrication limit determined by the photolithography equipment used, for example up to five times at increasingly smaller scales. The sequence of segments represents the vertical sidewall edge of the III-N body layer 17 in the gate region 81 as seen from the top-view and corresponds to the gate-width ($W_G$) of device 200-600 and 900-1000.

Figure 14D:
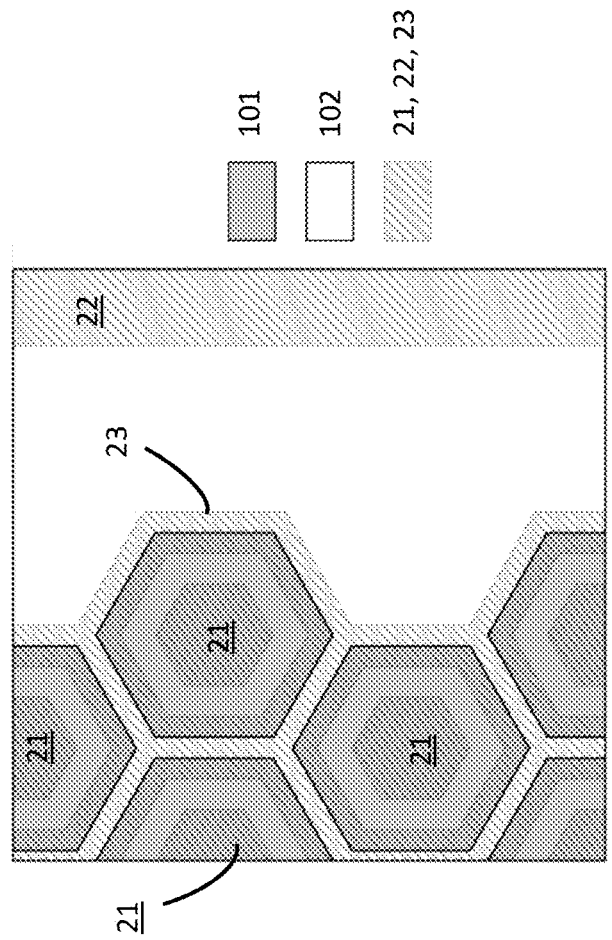
FIGS. 14C-D show a top-view of a fourth layout which is rotated 90° compared to the third layout shown in FIG. 14A-B.
Figure 14C:
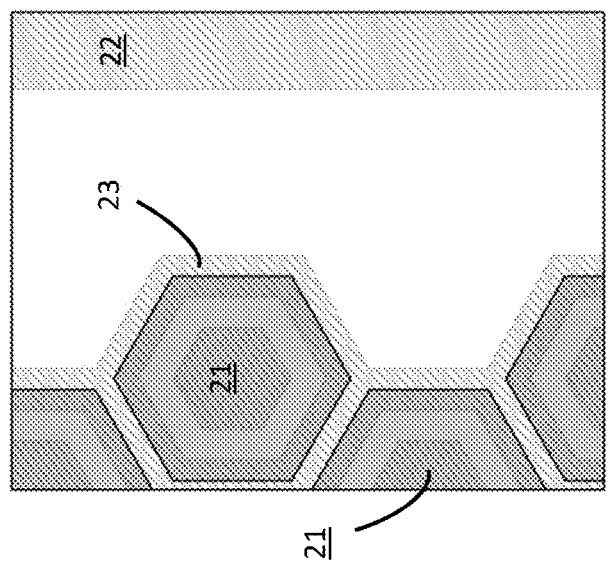

FIG. 14A, FIG. 14B, FIG. 14C, and FIG. 14D show the top-view section of a third device layout, hereafter referred as "island-layout", where the boundaries between the vertical device section 101 and the lateral device section 102 are defined by an array of closed shapes, hereafter referred to as "islands". The array of islands can be one-dimensional, i.e., the islands are repeated in the transverse direction (i.e., parallel to the drain contact) only in FIG. 14A or bi-dimensional, i.e., the islands are repeated both in the transverse and longitudinal directions as seen in FIG. 14B. The diameter of each island can be between 1 µm and 100 µm. The spacing between each island can be between 1 µm and 100 µm. The island can have the shape of a regular polygon, an irregular polygon, a circle, or any other appropriate shape. The island can have the shape of a regular hexagon. The island can have any orientation. If the island is a regular hexagon, the orientation of the island can be such that the hexagon flat is perpendicular to the drain contact, as seen in FIG. 14A and FIG. 14B or parallel to the drain contact, as seen in FIG. 14C and FIG. 14D. The perimeter of each island represents the vertical gate-sidewall seen from top-view. The sum of the perimeters of all islands corresponds to the gate-width of the device. The gate contact 23 is deposited over the gate region 81 such that it covers the vertical sidewall along the island perimeter. The source contact 21 is deposited in a sector of each island such that to ensure the electrical connections to the III-N body layer 17 and III-N capping layer 18. The cross-sectional view of devices 200-600 and 900-1000 shown in FIGS. 2-6 and 9-10 can be indicated by the dashed line 8(a)' and 8(b)' as shown in FIGS. 14A and 14B. The advantages of the "island-layout" are similar to the advantage of the "comb-layout" such as reducing the gate channel resistance, and the overall on-state resistance of the device.

FIG. 15A shows an example III-N material structure embodiment (such as the material structure of device 600 of FIG. 6) with the detailed III-N material layer structure used to form a tunnel junction between the source contact 21 and the p-type III-N body layer 17 indicated by the dashed region 151 in FIG. 15A, and the body diode formed between the source and the drain. As previously described in FIG. 2, as the interface between the p-type GaN body layer 17 and the n-type GaN capping layer 18, a tunnel junction contact can be formed by introducing a highly doped p-type GaN region 154 (i.e., p++ GaN) at the top surface of the III-N body layer 17 (e.g., between 2 nm and 50 nm thick with a doping density greater than $5 \times 10^{19}$ cm$^{-3}$) and a highly doped n-type GaN region 152 (i.e., n++ GaN) at the bottom surface of the III-N capping layer 18 (e.g., between 2 nm and 50 nm thick with a doping density greater than $5 \times 10^{19}$ cm$^{-3}$). The quality of the tunnel junction in N-polar III-N materials can further be improved by inserting a thin $Al_yGa_{1-y}N$ (0<y≤1) layer 153 between the layer 152 and layer 154 (such that the tunnel junction interface region 151 is p+ GaN/p++ GaN/ $Al_yGa_{1-y}N$/n++ GaN/n+ GaN). The thickness of the thin $Al_yGa_{1-y}N$ layer 153 can be between 0.5 nm to 5 nm, preferably between 0.5 nm and 2 nm. Preferably, the $Al_yGa_{1-y}N$ layer 153 has high aluminum composition, for example the composition of aluminum (y) can be greater than 50% (i.e., y>0.5). The aluminum composition can be near 100% (i.e., y=1) such that the layer is AlN. The p$^{++}$ layer 154 and n$^{++}$ layer 152 can be 10-30 nm thick and have a Mg and Si concentration of greater than $5 \times 10^{19}$ cm$^{-3}$, respectively.

The tunnel junction 151 has been introduced to improve the electrical contact between the metal of the source contact 21 and the p-type III-N body layer 17. In order to verify the current blocking properties of the p-type III-N body layer 17, the material structure of FIG. 15A was characterized as shown by FIG. 15B as a two terminal body-diode between the source and drain contacts 21 and 22. Here, the current-voltage curve AA shows the rectifying behavior of the body diode. When the anode (i.e., source contact) is forward-biased (in voltage range AB), the body-diode operates in conduction-mode (with current density of ~50 A/cm$^2$), and when the anode is reverse-biased (in voltage range AC), the body diode operates in blocking mode (with leakage current up to ~200 μA/cm$^2$), as shown in FIG. 15B.

Figure 15D:
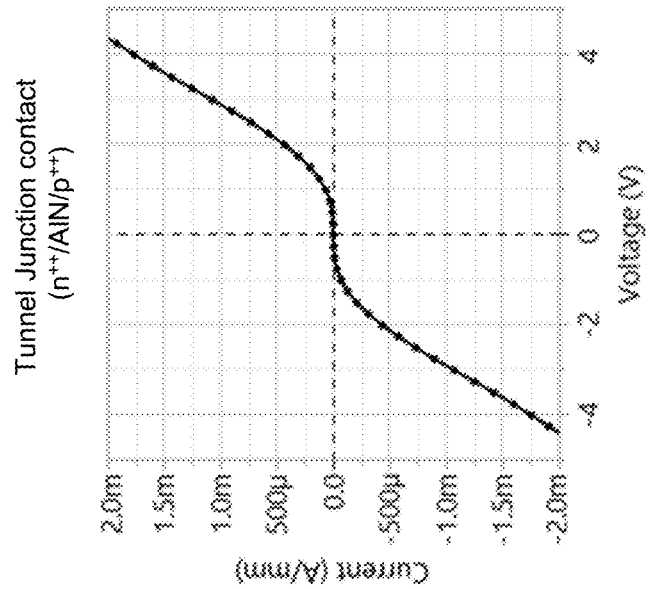
Figure 15C:
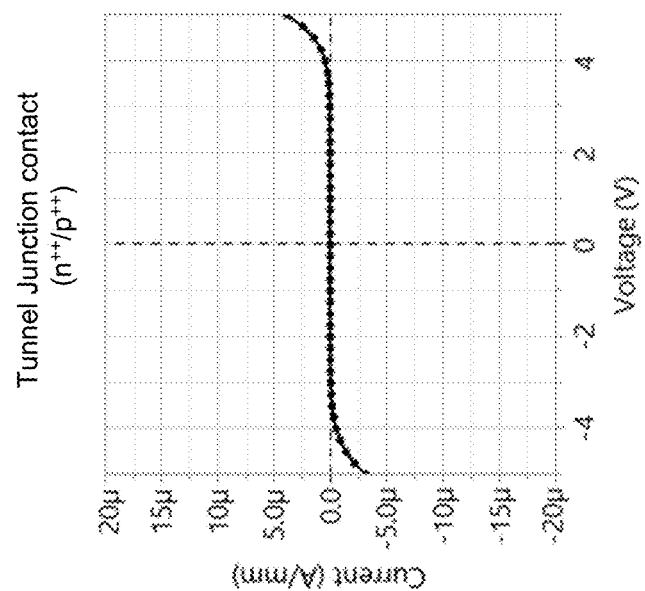

FIG. 15C shows a current-voltage curve for a p++/n++ tunnel junction and FIG. 15D shows a current-voltage curve for a p++/AlN/n++ tunnel junction such as the structure shown in the dashed region 151 of FIG. 15A. The contact resistance of the tunnel junction with an inserted AlN inter-layer 153 at the interface between the highly doped p-type GaN layer 154 and the highly doped n-type GaN layer 152 in FIG. 15D is much lower than the contact resistance of the tunnel junction structure of FIG. 15C where the AlN inter-layer 153 is omitted, as indicated by the slope of the curves in the aforementioned figures.

Figure 16A:
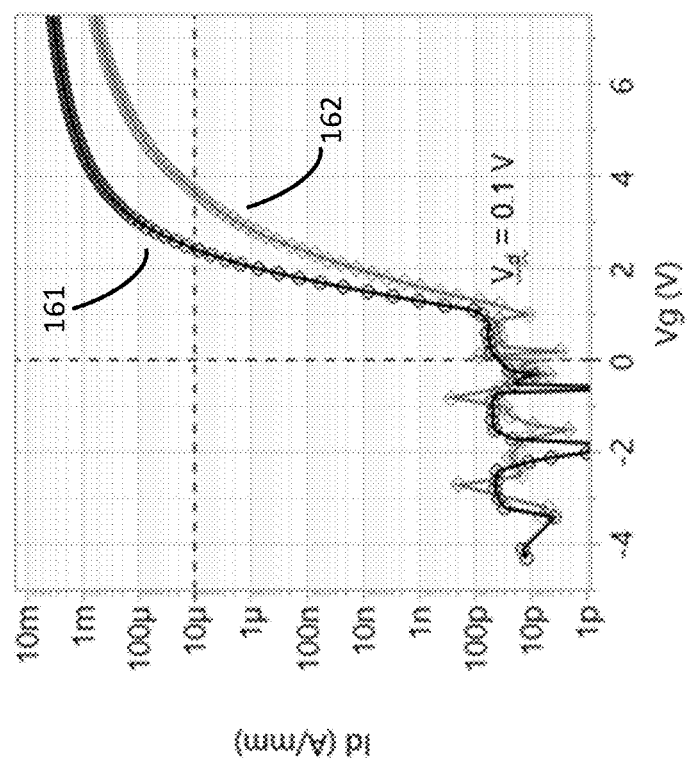
FIGS. 16A-C show current-voltage curves detailing the characteristics of a mobility enhancement layer.

Characterization of a transistor device fabricated without a mobility enhancement layer and a transistor device fabricated with a 2.6 nm GaN mobility enhancement layer is shown in FIG. 16A (such as the GaN mobility enhancement layer 31 in FIG. 6). For the device without mobility enhancement layer, indicated by curve 162, threshold-voltage at 10 μA/mm ($V_{th}$), subthreshold slope (SS), and estimated vertical channel mobility (μ) are +3.5 V, 360 mV/dec and 4.3 cm$^2$/V·s, respectively. For the device with mobility enhancement layer, indicated by curve 161, the threshold-voltage at 10 μA/mm ($V_{th}$), subthreshold slope (SS) and estimated vertical channel mobility (μ) are +2.2 V, 228 mV/dec and 26 cm$^2$/V·s. The threshold voltage of the device with the mobility enhancement layer is shifted lower, as expected, by moving the channel in the gate region further away from the p-type body layer. The beneficial role of the mobility enhancement layer can be also observed in output-curves ($I_{ds}$-vs-$V_{ds}$ acquired at $V_g$=0V, +2.5V, +5V, +7.5V) illustrated in FIG. 16B and FIG. 16C. The devices fabricated with a mobility enhancement layer (shown in FIG. 16C) have lower sidewall channel $R_{on}$ (20.0 Ω·mm vs 4.25 Ω·mm) and higher drain saturation current (42 mA vs 5 mA/mm at $V_g$=+7.5V) than devices fabricated without the mobility enhancement layer (shown in FIG. 16B).

Figures 16B, 16C:
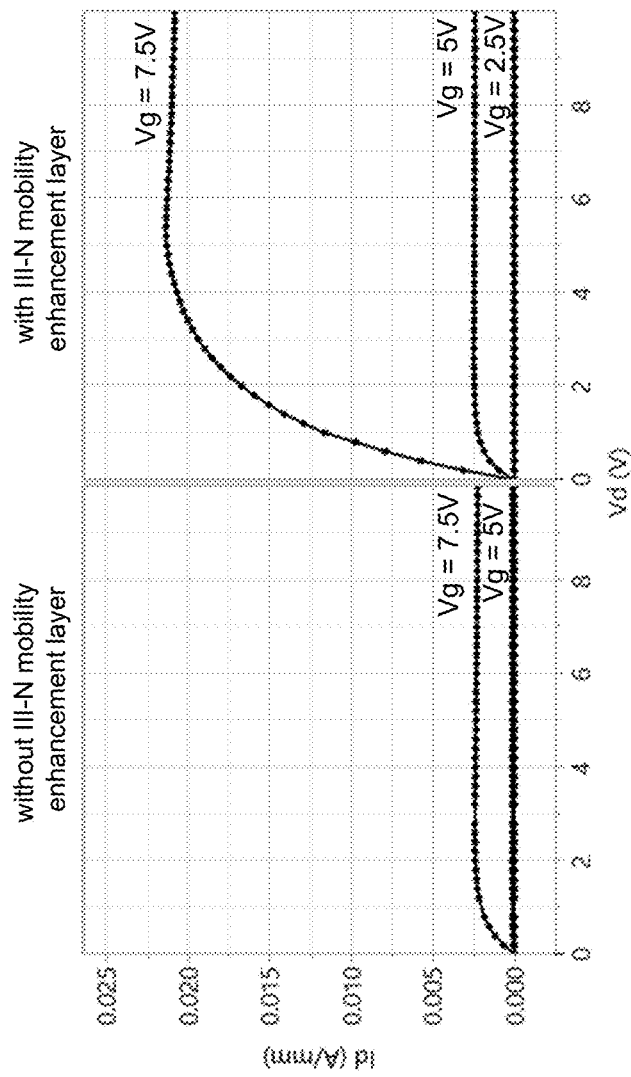
Figures 17A, 17B, 17C:
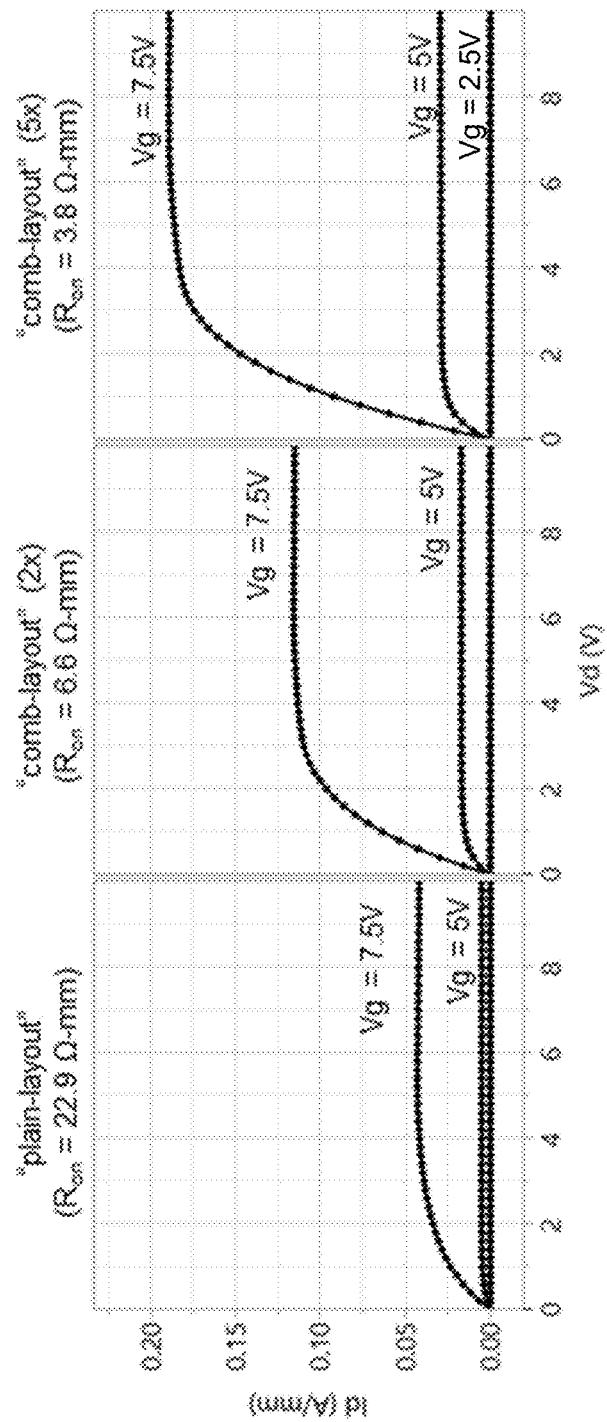
FIGS. 17A-C shows current-voltage curves detailing the characteristics of alternative gate layout structures.

Next, devices fabricated with the mobility enhancement layer as shown in FIG. 16C were further characterized using different gate structures such as those shown in FIG. 12 and FIG. 13C. Current-voltage output curves for devices with gate sidewall designs of the "plain-layout," of the 2× "comb-layout," and of the 5× "comb-layout" are shown in FIG. 17A, FIG. 17B, and FIG. 17C, respectively. The output curves show the devices exhibiting an on-resistance of 22.9 Ω·mm, 6.6 Ω·mm and 3.8 Ω·mm, respectively, and a drain saturation current at Vg=+7.5V of 42 mA/mm, 115 mA/mm and 189 mA/mm, respectively. Significant on-resistance improvements can be achieved by implementing a gate structure with the "comb-layout" compared to devices fabricated with the "plain-layout." No detrimental impact on threshold voltage, subthreshold slope and mobility has been observed in "comb layout" transistors compared to the "plain-layout".

Figure 18:
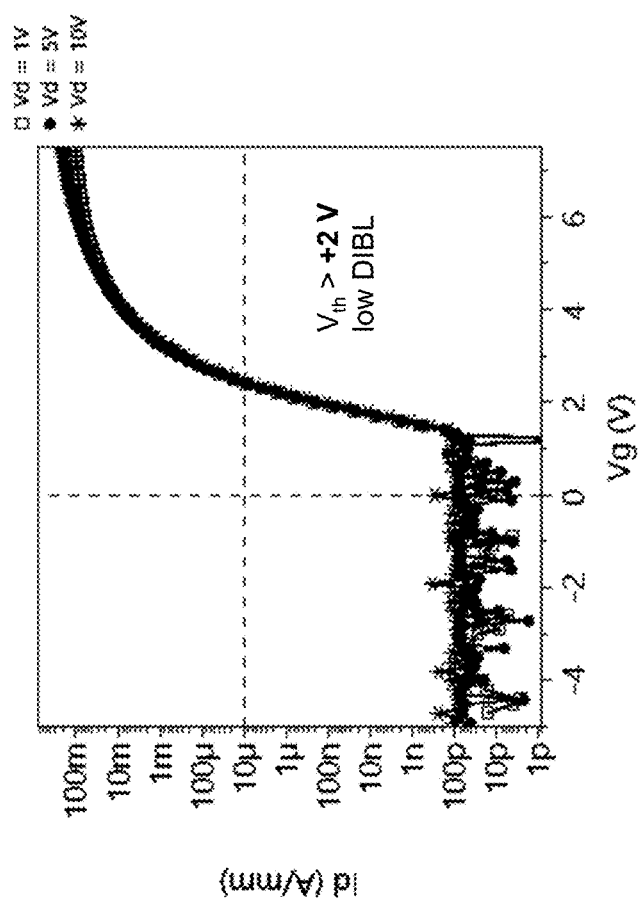
FIG. 18 is a current-voltage transfer curve of a device with high threshold voltage stability.

FIG. 18 shows current-voltage curves acquired from a device similar to device 600 fabricated with a 5× "comb layout" and a 2.6 nm GaN mobility enhancement layer, at sequentially increasing drain biases of 1V, 5V and 10V, respectively. The device of FIG. 18 has a $V_{th}$ greater than 2V with no observable $V_{th}$ shift when biased at sequentially higher drain voltages, indicating negligible Drain-Induced Barrier Lowering (DIBL) and excellent blocking properties of the gate module equipped with p-type GaN body layer.

Figure 19:
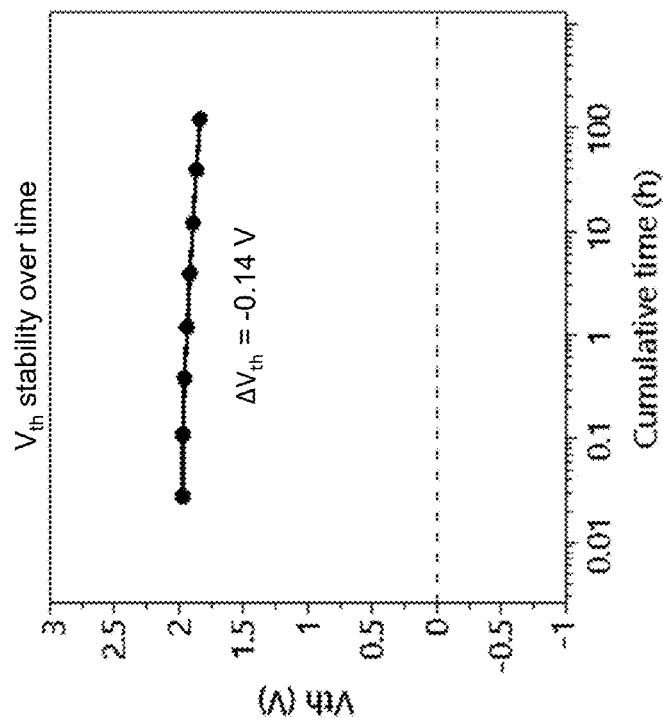
FIG. 19 details a device's positive threshold voltage stability over time.

To further assess the devices threshold stability, Vth has been tested during high-temperature off-state stress and high-temperature negative gate-bias stress. High-temperature off-state stress is performed at 130° C. with ($V_g$; $V_d$)=(0V; 10V) for greater than 120 hours. At logarithmic time intervals, gate-voltage is swept in a positive direction to acquire a current-voltage transfer curve. The variance of $V_{th}$ is plotted as a logarithmic function of time in FIG. 19. After more than 120 hours of gate stress, $V_{th}$ experienced a relatively small negative Vth shift ~0.14V, and the device remained normally off (i.e., $V_{th}$>0V) throughout the stress period.

Figure 20:
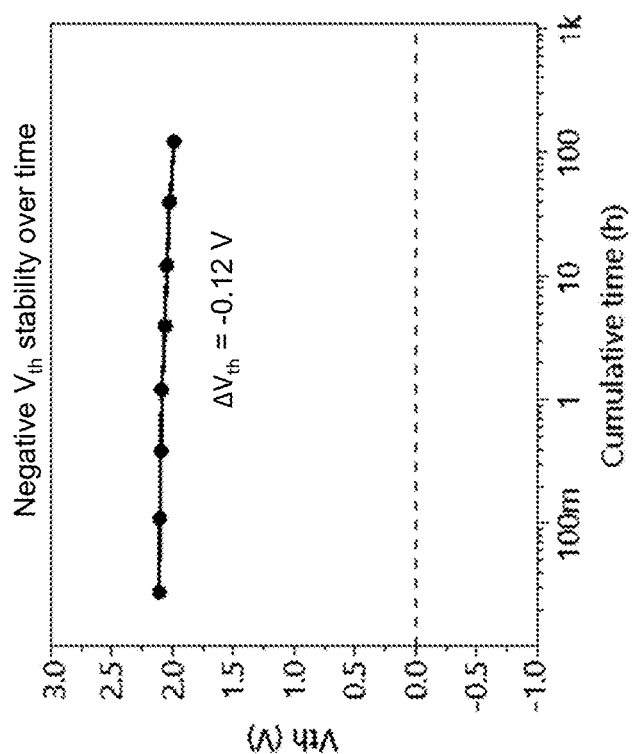
FIG. 20 details a device's negative threshold voltage stability over time.

High-temperature negative-bias stress has been carried out at 130° C. with ($V_g$; $V_d$)=(-4V; 0.1V) for greater than 120 hours. At logarithmic time intervals, gate-voltage is swept in a negative direction to acquire a current-voltage transfer curve. The variance of Vth is plotted as a logarithmic function of time in FIG. 20. After more than 120 hours, the threshold voltage indicated a relatively small negative $V_{th}$ shift ~0.12V.

Under both stress conditions (off-state and negative gate-bias), the devices maintain normally-off properties throughout the stress period. No degradation of subthreshold slope and subthreshold leakage has been observed. Relatively stable Vth under off-state and negative gate-bias further demonstrates the excellent electrostatic characteristics of the gate module equipped with p-type GaN body layer.

A number of implementations have been described. Nevertheless, it will be understood that various modifications may be made without departing from the spirit and scope of the techniques and devices described herein.

Embodiments

Although the present invention is defined in the attached claims, it should be understood that the present invention can also (alternatively) be defined in accordance with the following embodiments:

A1. An embodiment can include a III-N device, comprising: a III-N material structure over a substrate, wherein the III-N material structure comprises a III-N buffer layer, a III-N barrier layer, and a III-N channel layer, wherein a compositional difference between the III-N barrier layer and the III-N channel layer causes a 2DEG channel to be induced in the III-N channel layer; a p-type III-N body layer over the III-N channel layer in a source side access region of the device but not over the III-N channel layer in a drain side access region of the device; and an n-type III-N capping layer over the p-type III-N body layer; a source electrode, a gate electrode, and a drain electrode each over the III-N material structure on a side opposite the substrate; wherein the source electrode contacts the n-type III-N capping layer and is electrically connected to the p-type III-N body layer, and the drain electrode contacts the III-N channel layer; and wherein the source electrode is electrically isolated from the 2DEG channel when the gate electrode is biased relative to the source electrode at a voltage that is below a threshold voltage of the device.

A2. The embodiment of A1, wherein the III-N device is an N-polar device.

A3. The embodiment of A2, wherein the III-N barrier layer is between the III-N channel layer and the III-N buffer layer.

A4. The embodiment of any of A1-A3, further comprising a gate insulator layer, wherein the gate insulator layer and the gate electrode are formed over a vertical or slanted sidewall of the p-type layer in a gate region of the device, the gate electrode further comprising a first portion extending towards the source electrode and a second portion extending towards the drain electrode.

A5. The embodiment of A4, wherein the III-N device is configured such that an inversion channel is formed in the p-type III-N body layer adjacent to the gate insulator layer when the gate electrode is biased relative to the source electrode at a voltage greater than the threshold voltage of the device, and the inversion channel electrically connects the source electrode to the 2DEG channel while a positive voltage is applied to the drain electrode.

A6. The embodiment of A4 or A5, wherein the III-N device is configured such that while the gate electrode is biased relative to the source electrode at a voltage greater than the threshold voltage of the device, a conductive device channel including the 2DEG channel extends continuously from the source electrode to the drain electrode, and while the gate electrode is biased relative to the source electrode at a voltage less than the threshold voltage and the drain electrode has a positive voltage bias relative to the source electrode, the device channel is depleted of mobile charge in the gate region of the III-N device.

A7. The embodiment of A4, A5 or A6, further comprising a III-N layer structure between the gate insulator layer and the III-N body layer.

A8. The embodiment of A7, wherein the III-N layer structure contacts the III-N capping layer in the source side access region and contacts the III-N channel layer in the drain side access region.

A9. The embodiment of A7 or A8, wherein the III-N layer structure extends continuously between the source electrode and the drain electrode.

A10. The embodiment of A7, A8 or A9, wherein the III-N layer structures at least comprises a GaN layer in contact with the III-N body layer.

A11. The embodiment of A10, wherein the III-N layer structure further comprises an $Al_xGa_{1-x}N$ layer between the gate insulator layer and the GaN layer, wherein x is between 0.5 and 1.

A12. The embodiment of any of A4-A11, wherein an angle between the vertical or slanted sidewall of the III-N body layer and a top surface of the III-N material structure is between 20° and 80°.

A13. The embodiment of any of A1-A12, further comprising an AlN layer having a thickness in a range of 0.5 nm to 5 nm between the III-N body layer and the III-N material structure.

A14. The embodiment of any of A1-A13, further comprising an AlN layer having a thickness in a range of 0.5 nm to 5 nm between the III-N body layer and the III-N capping layer.

A15. The embodiment of any of A1-A14, wherein the source electrode is directly contacting and electrically connected to the p-type III-N body layer.

B1. An embodiment can include a III-N transistor comprising: a III-N material structure; a drain electrode connected to a lateral 2DEG channel in the III-N material structure; a source electrode separated from the lateral 2DEG channel by a current blocking layer; and a gate electrode configured to modulate current flowing in a slanted or vertical channel between the source electrode and the lateral 2DEG channel; wherein a threshold voltage of the transistor is greater than 0V.

B2. The embodiment of B1, wherein the current blocking layer has a thickness greater than 50 nm.

B3. The embodiment of B1 or B2, wherein the current blocking layer is doped p-type, and the vertical channel of the transistor is substantially depleted of electrons when the gate electrode is biased relative to the source electrode at a voltage that is below the threshold voltage of the transistor.

B4. The embodiment of B1, B2 or B3, wherein an angle between the slanted or vertical channel and the lateral 2DEG channel is between 20° and 80°.

B5. The embodiment of any of B1-B4, further comprising a III-N layer structure between the current blocking layer and the gate electrode.

C1. An embodiment can include an electronic device, comprising: an N-polar III-N material structure, wherein the III-N material structure comprises a III-N channel layer, a p-type GaN body layer, and an n-type GaN capping layer; a gate contact between a source contact and a drain contact, wherein the p-type GaN body layer is between the source contact and the III-N channel layer and the drain contact directly contacts the III-N channel layer; and a III-N layer structure between the gate contact and a sidewall of the p-type GaN body layer, wherein the III-N layer structure contacts the n-type GaN capping layer in a first region between the source contact and the gate contact and contacts the III-N channel layer in a second region between the gate contact and the drain contact.

C2. The embodiment of C1, wherein the III-N layer structure is continuous between the source and drain contact.

C3. The embodiment of C1 or C2, wherein the III-N layer structure comprises a GaN layer.

C4. The embodiment C3, wherein the III-N layer structure further comprises an $Al_yGa_{1-y}N$ layer, wherein y is greater than 0.5.

C5. The embodiment of C3 or C4, wherein the thickness of the GaN layer is between 2 nm and 10 nm.

C6. The embodiment of any of C1-C5, wherein the sheet-resistance of the n-type GaN capping layer is lower than the sheet-resistance of the III-N channel layer.

C7. The embodiment of any of C1-C6, wherein the p-type GaN body layer has a thickness between 2 nm and 5 μm and a doping density less than $5 \times 10^{19}$ cm$^{-3}$.

C8. The embodiment of any of C1-C7, wherein the thickness of the III-N channel layer in the second region is less than the thickness of the III-N channel layer in the first region.

C9. The embodiment of any of C1-C8, wherein the composition of the III-N channel layer is graded such that the gradient of the polarization field is negative in the [0 0 0 -1] direction.

C10. The embodiment of any of C1-C9, wherein the III-N material structure further comprises a III-N back-barrier layer where the III-N channel layer is between the p-type GaN body layer and the III-N back-barrier layer.

C11. The embodiment of C10, wherein the III-N back-barrier layer comprises a first portion, a second portion and a third portion; wherein the first portion comprises n-type GaN, the second portion comprises AlGaN with a varying composition, and the third portion comprises AlGaN with a constant composition.

C12. The embodiment of C11, wherein the n-type GaN is doped with silicon.

D1. An embodiment can include an electronic device, comprising: an N-polar III-N material structure comprising a first n-type GaN layer with a first doping density over a first p-type GaN layer with a second doping density; and an electrode at least partially over the n-type GaN layer; wherein the electrode is electrically connected to the p-type layer through a tunnel junction; and the tunnel junction comprises an $Al_yGa_{1-y}N$ layer with $0<y\leq1$ in an interface between the p-type GaN layer and the n-type GaN layer.

D2. The embodiment of D1, further comprising a recess in the n-type layer, wherein the electrode is at least partially in the recess.

D3. The embodiment of D2, wherein at least a portion of the recess extends to a top surface of the p-type GaN layer, and a portion of the electrode is directly contacting the p-type GaN layer, wherein the tunnel junction is formed between the electrode and the p-type GaN layer through a sidewall of the recess in the n-type layer.

D4. The embodiment of any of D1-D3, wherein y is greater than 0.5, and the thickness of $Al_yGa_{1-y}N$ layer is between 0.5 nm and 5 nm.

D5. The embodiment of any of D1-D4, wherein the tunnel junction further comprises a second n-type GaN layer between the first n-type GaN layer and the $Al_yGa_{1-y}N$ layer, and a second p-type GaN layer between the first p-type GaN layer and the $Al_yGa_{1-y}N$ layer, wherein the second n-type GaN layer and the second p-type GaN layer have a doping density greater than the first and second doping densities.

D6. The embodiment of D5, wherein the second p-type GaN layer and the second n-type GaN layer each have a thickness between 2 nm and 50 nm and a doping density greater than $5\times10^{19}$ $cm^{-3}$.

D7. The embodiment of any of D1-D6, wherein the first p-type GaN layer has a thickness between 2 nm and 5 μm and a doping density less than $5\times10^{19}$ $cm^{-3}$.

E1. An embodiment can include a method of operating a III-N device, the method comprising: biasing a gate contact relative to a source contact at a voltage greater than a threshold voltage, wherein an inversion channel forms at a vertical interface between a gate insulator layer and a p-type III-N layer, thereby electrically connecting the source contact to a lateral 2DEG channel; and biasing a drain contact at a positive voltage relative to the source contact; wherein electrons flow from the source contact through the inversion channel, and into the lateral 2DEG channel; and a continuous device channel is formed between the source contact and the drain contact.

E2. The embodiment of E1, further comprising biasing the gate contact relative to the source contact at a voltage less than the threshold voltage; wherein the p-type III-N layer fully depletes any charge at the vertical interface between the p-type III-N layer and the gate insulator layer such that there is no inversion channel and the device channel is discontinuous between the source contact and the lateral 2DEG channel.

E3. The embodiment of E1 or E2, further comprising: biasing the drain contact at a positive voltage greater than a minimum voltage; wherein the 2DEG channel is fully depleted of charge in a source side access region.

E4. The embodiment of E3, wherein the minimum voltage is less than 10V.

F1. An embodiment can include an electronic device, comprising: a substrate and a III-N material structure over the substrate; and a gate electrode and a gate insulating layer, the gate insulating layer being between the III-N material structure and the gate electrode; and a source electrode and a drain electrode, the source electrode comprising a portion contacting the III-N material structure, the source electrode and the drain electrode being on a side of the III-N material structure opposite the substrate; wherein the portion of source electrode in contact with the III-N material structure is formed between the gate electrode and the drain electrode.

F2. The embodiment of F1, further comprising: a gate region and an access region, that gate region being under the gate electrode, and the access region being between the gate electrode and the drain; and the III-N material structure comprises a primary III-N channel layer and a primary III-N barrier layer wherein a compositional difference induces a primary 2DEG channel extending between the gate region and the drain.

F3. The embodiment of F1 or F2, the III-N material structure comprising: an insulating GaN layer over the III-N channel layer; and the insulating GaN layer being between the portion of the source electrode contacting the III-N material structure and the 2DEG channel.

F4. The embodiment of F1 or F2, the III-N material structure comprising a p-type GaN layer over the III-N channel layer; and the p-type GaN layer being between the portion of the source electrode contacting the III-N material structure and the 2DEG channel.

F5. The embodiment of F4, the device further comprising: a n-type GaN layer over the p-type GaN layer, the source electrode is connected to the n-type GaN layer and the p-type GaN layer; and the n-type GaN layer and the p-type GaN layer extend between the source electrode and the gate region.

F6. The embodiment of F4 or F5, the device further comprising: a regrown III-N layer structure comprising a GaN/AlGaN layer, the regrown III-N layer formed between the gate insulating layer and the p-type GaN layer; wherein a current conducting channel in the gate region extends through the regrown III-N layer when the device is biased above a threshold voltage.

F7. The embodiment of any of F1-F6, wherein the III-N material structure comprises: a secondary III-N channel layer and a secondary III-N barrier layer formed between the substrate and the primary III-N channel layer, wherein a compositional difference induces a secondary 2DEG channel extending between the gate region and the drain.

F8. The embodiment of F7, wherein alternating III-N channel and III-N barrier layer in the III-N material structure η-times in the device will induce η-number of 2DEG channels.

F9. The embodiment of F8, wherein the composition of each III-N barrier layer is configured such that the induced charge is reduced with each subsequent layer, with the lowest charge being in the 2DEG channel proximal to the substrate and the highest charge being in the channel distal to the substrate.

G1. An embodiment can include an electronic device, comprising: a III-N material structure over a substrate, wherein the III-N material structure comprises: a III-N channel layer over a III-N buffer layer; a III-N barrier layer over the III-N channel layer, wherein a compositional difference between the III-N barrier layer and the III-N channel layer causes a lateral 2DEG channel to be induced in the III-N channel layer; a source contact, a gate contact, and a drain contact over the III-N material structure on a side opposite the substrate; and a p-type III-N body layer over the III-N barrier layer in a source side access region but not over the III-N barrier layer in a drain side access region; and the source contact is electrically connected to the p-type III-N body layer; and the drain is electrically connected to the 2DEG channel and the source is electrically isolated from the 2DEG channel when the device is biased below a threshold voltage.

G2. The embodiment of G1, the device further comprising a gate insulator layer; wherein the gate insulator layer and the gate contact are formed over a vertical sidewall of the p-type III-N body layer in a gate region, the gate contact comprising a first portion extending towards the source contact and a second portion extending towards the drain contact.

G3. The embodiment of G1 or G2, the device further comprising a recess formed through the III-N barrier layer in the gate region exposing a top surface of the III-N channel layer in a region between the vertical sidewall of the p-type III-N body layer and the drain contact.

G4. The embodiment of G3, further comprising an additional III-N layer structure formed between the gate insulator layer and the III-N body layer; and the additional III-N layer structure is at least partially formed in the recess.

G5. The embodiment of G3 or G4, wherein the gate insulator layer and the gate contact are at least partially formed in the recess.

G6. The embodiment of G3, G4 and G5, wherein the region of the III-N channel layer below the recess is doped with silicon.

G7. The embodiment of any of G4-G6, wherein an electron channel is formed in the additional III-N layer structure in the gate region of the device when the device is biased at a voltage greater than the threshold voltage; and the electron channel electrically connects the source contact to the 2DEG channel when a positive voltage is applied to the drain.

G8. The embodiment of G7, wherein the threshold voltage is greater than 0V.

G9. The embodiment of any of G4-G8, wherein the additional III-N layer structure extends continuously between the source contact and the drain contact.

G10. The embodiment of any of G4-G9, wherein the additional III-N layer structures comprises a GaN mobility enhancement layer in contact with the III-N body layer and an AlGaN mobility enhancement layer in contact with the GaN mobility enhancement layer.

G11. The embodiment of G10, wherein an aluminum composition of the AlGaN mobility enhancement layer is greater than 50% aluminum compared to the total group-III material composition.

G12. The embodiment of any of G1-G10, wherein the vertical side wall of the III-N body layer in the gate region contains an angle relative to a top surface of the III-N barrier layer opposite the substrate; wherein the angle is between 20° and 80°.

G13. The embodiment of any of G1-G11, wherein the device further comprises an AlN layer disposed between the III-N body layer and the III-N barrier layer, and the AlN layer has a thickness between 0.5 nm and 5.0 nm.

G14. The embodiment of any of G1-G12, wherein the device further comprises an AlN layer disposed between the III-N body layer and a III-N capping layer, and the AlN layer has a thickness between 0.5 nm and 5.0 nm.

H1. An embodiment can include a III-N device, comprising: a III-N material structure over a substrate; the III-N material structure comprising a III-N buffer layer and a p-type layer over the III-N buffer layer in a source side access region but not over the III-N buffer layer in a drain side access region; and a source contact, a gate contact, and a drain contact over the III-N buffer layer on a side opposite the substrate; and a III-N channel layer and a III-N barrier layer formed over the III-N material structure extending between the source contact and the drain contact; wherein a compositional difference between the III-N barrier layer and the III-N channel layer causes a 2DEG channel to be induced in the III-N channel layer; and the source contact is connected to the p-type layer and a sidewall angle of the p-type layer forms a semi-polar crystal orientation of the III-N channel layer in a region below the gate contact.

H2. The embodiment of H1, wherein the III-N channel layer has a thickness between 10 nm and 300 nm.

H3. The embodiment of H1 or H2, wherein the III-N barrier layer has a thickness between 1 nm and 100 nm.

H4. The embodiment of H1, H2 or H3, wherein the device is a depletion mode device.

I1. An embodiment can include an electronic device, comprising: an N-polar III-N material structure over a substrate, wherein the III-N material structure comprises a III-N barrier layer over a III-N buffer layer, and a III-N channel layer over the III-N barrier layer, wherein a compositional difference between the III-N barrier layer and the III-N channel layer causes a lateral 2DEG channel to be induced in the III-N channel layer; a p-type III-N body layer over the III-N channel layer in a source side access region, the p-type III-N body layer having a sidewall at a non-zero angle relative to a top surface of the III-N channel layer; a n-type III-N capping layer over the p-type III-N body layer; a source contact contacting the n-type III-N capping layer; a drain contact contacting the III-N channel layer; a gate insulator layer contacting a gate contact; and the gate insulator layer contacting the sidewall of the p-type III-N body layer at the non-zero angle.

I2. The embodiment of I1, further comprising an additional III-N layer structure formed between the gate insulator layer and the III-N body layer.

What is claimed is:
1. A III-N device, comprising:
a III-N material structure comprising a III-N channel layer over a III-N barrier layer, a p-type III-N layer over and directly contacting the III-N channel layer, and a 2DEG channel formed adjacent an interface between the III-N channel layer and the III-N barrier layer;
an n-type III-N layer over and directly contacting the p-type III-N layer,
a source electrode, a gate electrode, and a drain electrode each on a same side of the III-N material structure;
a gate insulator layer separating the gate electrode from the p-type III-N layer and the III-N channel layer; wherein the source electrode directly contacts the n-type III-N layer and is electrically connected to the p-type III-N layer;

the drain electrode is electrically connected to the 2DEG channel;

a portion of the III-N channel layer separates the gate insulator layer from the III-N barrier layer;

the p-type III-N layer is over the III-N channel layer in a source side access region of the device and does not extend past the gate electrode; and the 2DEG channel extends continuously through the III-N channel layer from below the source electrode to the drain electrode and the source electrode is electrically isolated from a portion of the 2DEG channel below the source electrode when the gate electrode is biased relative to the source electrode at a voltage that is below a threshold voltage of the device.

2. The device of claim 1, wherein the III-N material structure is grown in an N-polar orientation.

3. The device of claim 1, further comprising a first $Al_xGa_{1-x}N$ layer between the p-type III-N layer and the n-type III-N layer, wherein x is between 0.5 and 1, and a thickness of the $Al_xGa_{1-x}N$ layer is between 0.5 nm and 5 nm.

4. The device of claim 3, further comprising a second $Al_xGa_{1-x}N$ layer between the p-type III-N layer and the III-N channel layer, wherein x is between 0.5 and 1, and a thickness of the $Al_xGa_{1-x}N$ layer is between 0.5 nm and 5 nm.

5. The device of claim 1, wherein the gate insulator layer and the gate electrode are formed over a vertical or slanted sidewall of the p-type III-N layer in a gate region of the device, the gate electrode further comprising a first portion extending towards the source electrode and a second portion extending towards the drain electrode.

6. The device of claim 5, wherein an angle between the vertical or slanted sidewall of the p-type III-N layer and a top surface of the III-N material structure opposite is between 20° and 80°.

7. The device of claim 1, wherein the source electrode is directly contacting and electrically connected to the p-type III-N layer.

8. The device of claim 1, wherein when the gate electrode is biased relative to the source electrode at a voltage that is below a threshold voltage of the device, the 2DEG channel is fully depleted in a source-side region adjacent the source electrode.

9. The device of claim 1, wherein when the gate electrode is biased relative to the source electrode at a voltage that is above a threshold voltage and a positive voltage is applied to the drain electrode, electrons flow from the source towards the drain through the n-type III-N layer.

* * * * *